US008426941B2

(12) United States Patent
Sakurai et al.

(10) Patent No.: US 8,426,941 B2
(45) Date of Patent: Apr. 23, 2013

(54) SEMICONDUCTOR CHIP COMPRISING A DIRECTIONAL COUPLER HAVING A SPECIFIC MAIN LINE AND SUB-LINE ARRANGEMENT

(71) Applicants: Satoshi Sakurai, Tokyo (JP); Satoshi Goto, Tokyo (JP); Toru Fujioka, Tokyo (JP)

(72) Inventors: Satoshi Sakurai, Tokyo (JP); Satoshi Goto, Tokyo (JP); Toru Fujioka, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/666,248

(22) Filed: Nov. 1, 2012

(65) Prior Publication Data

US 2013/0056730 A1 Mar. 7, 2013

Related U.S. Application Data

(63) Continuation of application No. 11/964,217, filed on Dec. 26, 2007, now Pat. No. 8,334,580.

(30) Foreign Application Priority Data

Mar. 29, 2007 (JP) .................................. 2007-086385

(51) Int. Cl.
*H01L 27/06* (2006.01)
*H01L 23/528* (2006.01)
(52) U.S. Cl.
USPC ............. 257/508; 257/E23.169; 257/E21.575

(58) Field of Classification Search .................. 257/508, 257/E23.169, E21.575
See application file for complete search history.

(56) References Cited

U.S. PATENT DOCUMENTS

| 6,549,068 | B1 | 4/2003 | Bollenbeck |
| 7,068,115 | B2 | 6/2006 | Austin et al. |
| 7,187,062 | B2 | 3/2007 | Frank |
| 2001/0043130 | A1 | 11/2001 | Nagamori et al. |
| 2002/0105009 | A1 | 8/2002 | Eden et al. |
| 2002/0130733 | A1 | 9/2002 | Iida et al. |
| 2004/0125577 | A1 | 7/2004 | Vinciarelli et al. |
| 2004/0212432 | A1 | 10/2004 | Takahashi et al. |
| 2005/0231302 | A1 | 10/2005 | Frank |
| 2007/0096334 | A1 | 5/2007 | Kawabata et al. |
| 2008/0070519 | A1 | 3/2008 | Okabe |

FOREIGN PATENT DOCUMENTS

| JP | 8-307286 A | 11/1996 |
| JP | 10-242763 A | 9/1998 |
| JP | 2005-304047 A | 10/2005 |
| JP | 2006-507719 A | 3/2006 |
| JP | 2006-121123 A | 5/2006 |
| JP | 2006-237238 A | 9/2006 |
| JP | 2007-173314 | 7/2007 |

*Primary Examiner* — Tom Thomas
*Assistant Examiner* — Christopher M Roland
(74) *Attorney, Agent, or Firm* — Mattingly & Malur, PC

(57) ABSTRACT

A technique capable of promoting miniaturization of an RF power module used in a mobile phone etc. is provided. A directional coupler is formed inside a semiconductor chip in which an amplification part of the RF power module is formed. A sub-line of the directional coupler is formed in the same layer as a drain wire coupled to the drain region of an LDMOSFET, which will serve as the amplification part of the semiconductor chip. Due to this, the predetermined drain wire is used as a main line and the directional coupler is configured by a sub-line arranged in parallel to the main line via an insulating film, together with the main line.

21 Claims, 30 Drawing Sheets

SEMICONDUCTOR CHIP COMPRISING A DIRECTIONAL COUPLER HAVING A SPECIFIC MAIN LINE AND SUB-LINE ARRANGEMENT

CROSS-REFERENCE TO RELATED APPLICATION

The present application is a continuation of U.S. patent application Ser. No. 11/964,217, filed Dec. 26, 2007, which claims priority from Japanese patent application No. 2007-86385 filed on Mar. 29, 2007, the content of which is hereby incorporated by reference into this application.

BACKGROUND OF THE INVENTION

The present invention relates to a semiconductor device and, more particularly, to a technique that is useful for the semiconductor device having a power amplifier function.

In Japanese patent laid-open No. 2006-237238 (Patent Document 1), a technique is described, which mounts a semiconductor chip in which a power amplifier circuit is formed on a mounting substrate and further forms a directional coupler in the mounting substrate.

SUMMARY OF THE INVENTION

Recently, mobile communication devices represented by the communication systems, such as the GSM (Global System for Mobile Communications) system, the PCS (Personal Communication Systems) system, the PDC (Personal Digital Cellular) system, the CDMA (Code Division Multiple Access) system, etc., have spread all over the world. In general, the mobile communication device of this type includes an antenna that emits and receives radio waves, a radio frequency power amplifier (RF power module) that amplifies a power-modulated radio frequency signal and supplies it to the antenna, a reception part that processes a radio frequency signal received by the antenna, a control part that controls these components, and a battery that supplies a power supply voltage to these components.

As an amplifier element used in a power amplifier circuit of an RF power module of a mobile communication device, a compound semiconductor device, such as an HBT, HEMT, etc., a silicon bipolar transistor, an LDMOSFET (Laterally Diffused Metal Oxide Semiconductor Field Effect Transistor), etc., are used depending on the purposes and circumstances.

In addition, recently, a demand to reduce in size an RF power module is increasing as the mobile communication device becomes more multifunctional. The present inventors have been studying a technique to miniaturize an RF power module.

In an RF power module, a power amplifier circuit is formed and an output signal amplified in the power amplifier circuit is transmitted. The RF power module has a function of amplifying the power of the output signal and the output power is required to be a stable constant output. In the RF power module, the amplification of the output power by the power amplifier circuit is controlled by a control circuit. In other words, although in the RF power module, the output power is controlled to be constant by the control circuit, it is not necessarily stable and constant. Because of this, the RF power module is provided with a function of detecting the output power and feeding back so that the output power to be output from the RF power module is constant based on the detected output power. Such a part that detects the output power is called a directional coupler.

As shown in FIG. 32, a directional coupler 102 is mounted on a mounting substrate 100 constituting the RF power module along with a matching circuit etc. separately from a semiconductor chip 101. When the directional coupler 102 is formed on the mounting substrate 100, an area of about 1 mm$^2$ on the mounting substrate 100 is occupied by the directional coupler 102. As a result, along with the matching circuit mounted on the mounting substrate 100, the directional coupler 102 is a factor to prevent miniaturization of the mounting substrate 100. In particular, recently, in the RF power module that has become more multifunctional, the mounting substrate 100 is dense with the lines thereon and it is difficult to reserve an area for mounting the directional coupler 102.

When the directional coupler 102 is mounted on the mounting substrate 100 separately from the semiconductor chip 101, it is necessary to return the power detected by the directional coupler 102 to the control circuit formed in the semiconductor chip 101, and therefore, it is necessary to couple the directional coupler 102 and the semiconductor chip 101 with a wire. Because of this, it is necessary to reserve an area for wire bonding, and thus, the miniaturization of the mounting substrate 100 is more difficult.

An object of the present invention is to provide a technique capable of promoting the miniaturization of an RF power module used in a mobile phone etc.

The above and further objects and novel features of the present invention will more fully appear from the following detailed description in this specification and the accompanying drawings.

Preferred embodiments of the invention that will be disclosed herein are briefly outlined below.

A semiconductor device according to the present invention comprises a semiconductor chip including a power amplifier circuit, and the semiconductor chip has: (a) a semiconductor substrate; (b) a transistor constituting the power amplifier circuit formed over the semiconductor substrate; and (c) a directional coupler that detects output power output from the power amplifier circuit. Then, the directional coupler includes: (c1) a main line using the output wire of the transistor; and (c2) a sub-line the first terminal of which is electrically coupled with a detector circuit that converts the output from the directional coupler into a voltage or current and a second terminal of which, being the other terminal of the first terminal, is electrically coupled with a GND via a passive element. Here, the main line and the sub-line are arranged in parallel to each other and no conductor exists between the main line and the sub-line.

The effect brought about by preferred embodiments of the invention is briefly described as follows.

It is possible to promote the miniaturization of an RF power module used in a mobile phone etc. because a directional coupler is formed inside a semiconductor chip.

DETAILED DESCRIPTION OF THE PREFERRED EMBODIMENTS

Figure 1:
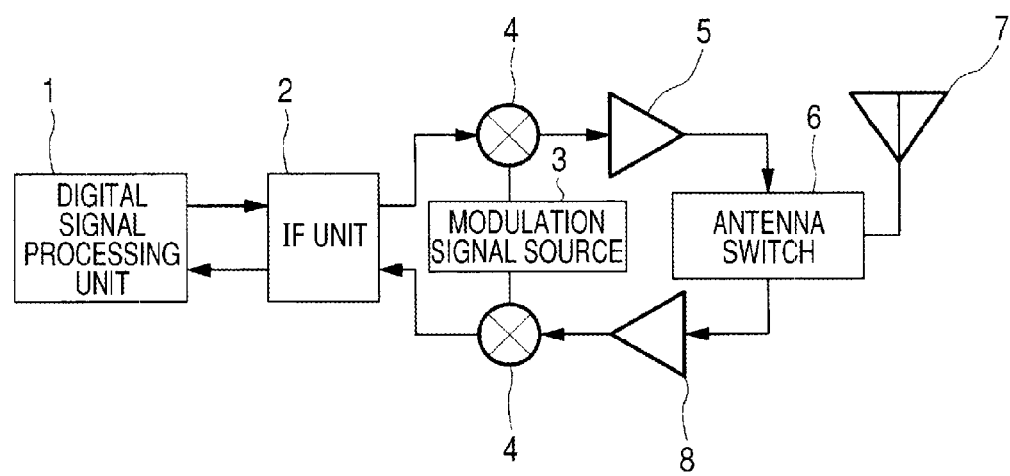
FIG. 1 is a block diagram of a signal transmission/reception part in a digital mobile phone.

In the following embodiments, when necessary for convenience, descriptions will be given by dividing the embodiment into a plurality of sections or embodiments, however, unless explicitly stated, they are not independent of one another, but one is related with the other part or the whole as a modification example, a detail, supplementary description, etc.

In addition, in the following embodiments, when referred to the number of elements etc. (number of units, numerical value, quantity, range, etc., are included), unless stated explicitly or except when the number is obviously limited to specific numbers in principle, the number is not limited to the specific ones but may be more or less than the specific numbers.

Further, in the following embodiments, it is needless to say that components (constituent steps etc. are also included) are not necessarily requisite unless stated explicitly or except when they are obviously requisite in principle.

Similarly, in the following embodiments, when shapes, positional relations, etc., of components etc. are referred to, unless stated explicitly or except when they can be thought otherwise in principle, those substantially approximate or similar to the shapes etc. are also included. This applies to the above-mentioned numerical values and ranges.

In all the drawings that illustrate the preferred embodiments, like members are designated by like reference numerals and repeated descriptions of such members are omitted. In order to make the drawings easier-to-see, hatching may be added even to plan views. A MOSFET described in the following embodiments is an example of a MISFET (Metal Insulator Semiconductor Field Effect Transistor) and the present invention includes the case where a high dielectric constant film with a higher dielectric constant than that of a silicon oxide film is used, in addition to the case where a silicon oxide film is used as a gate insulating film.

First Embodiment

FIG. 1 shows a block diagram of a signal transmission/reception part in, for example, a digital mobile phone. In FIG. 1, the signal transmission/reception part in the mobile phone has a digital signal processing unit 1, an IF (Intermediate Frequency) part 2, a modulation signal source 3, a mixer 4, an RF power module 5, an antenna switch 6, an antenna 7, and a low noise amplifier 8.

The digital signal processing unit 1 is adapted to generate a baseband signal by digitally processing an analog signal, such as a voice signal, and the IF unit 2 is adapted to convert the baseband signal generated in the digital signal processing unit 1 into an intermediate frequency signal.

The modulation signal source 3 is a circuit adapted to obtain a modulated signal using a reference oscillator, such as a crystal oscillator the frequency of which is stable, and the mixer 4 is a frequency converter that converts frequencies.

The RF power module 5 is a circuit that newly generates and outputs a high power signal similar to a weak input signal using the power supplied from a power supply.

The antenna switch 6 separates an input signal input to a digital mobile phone from an output signal output from the digital mobile phone.

The antenna 7 is used to transmit and receive radio waves and the low noise amplifier 8 amplifies a signal received by the antenna 7.

The digital mobile phone is configured as described above and its operations are briefly described below. First, the operation when transmitting a signal is described. A baseband signal generated by digitally processing an analog signal, such as a voice signal, in the digital signal processing unit 1 is converted into an intermediate frequency signal in the IF unit 2. Subsequently, the intermediate frequency signal is converted into a radio frequency (RF) signal by the modulation signal source 3 and the mixer 4. The signal converted into an RF signal is input to the RF power module 5. The RF signal input to the RF power module 5 is amplified by the RF power module 5, and then transmitted from the antenna 7 via the antenna switch 6.

Next, the operation when receiving a signal is described. The RF signal received by the antenna 7 is amplified by the low noise amplifier 8. Subsequently, the signal amplified by the low noise amplifier 8 is converted into an intermediate frequency signal by the modulation signal source 3 and the mixer 4, and then input to the IF unit 2. In the IF unit 2, the intermediate frequency signal is detected and a baseband signal is extracted. Then, the baseband signal is processed in the digital signal processing unit 1 and a sound signal is output.

Figure 2:
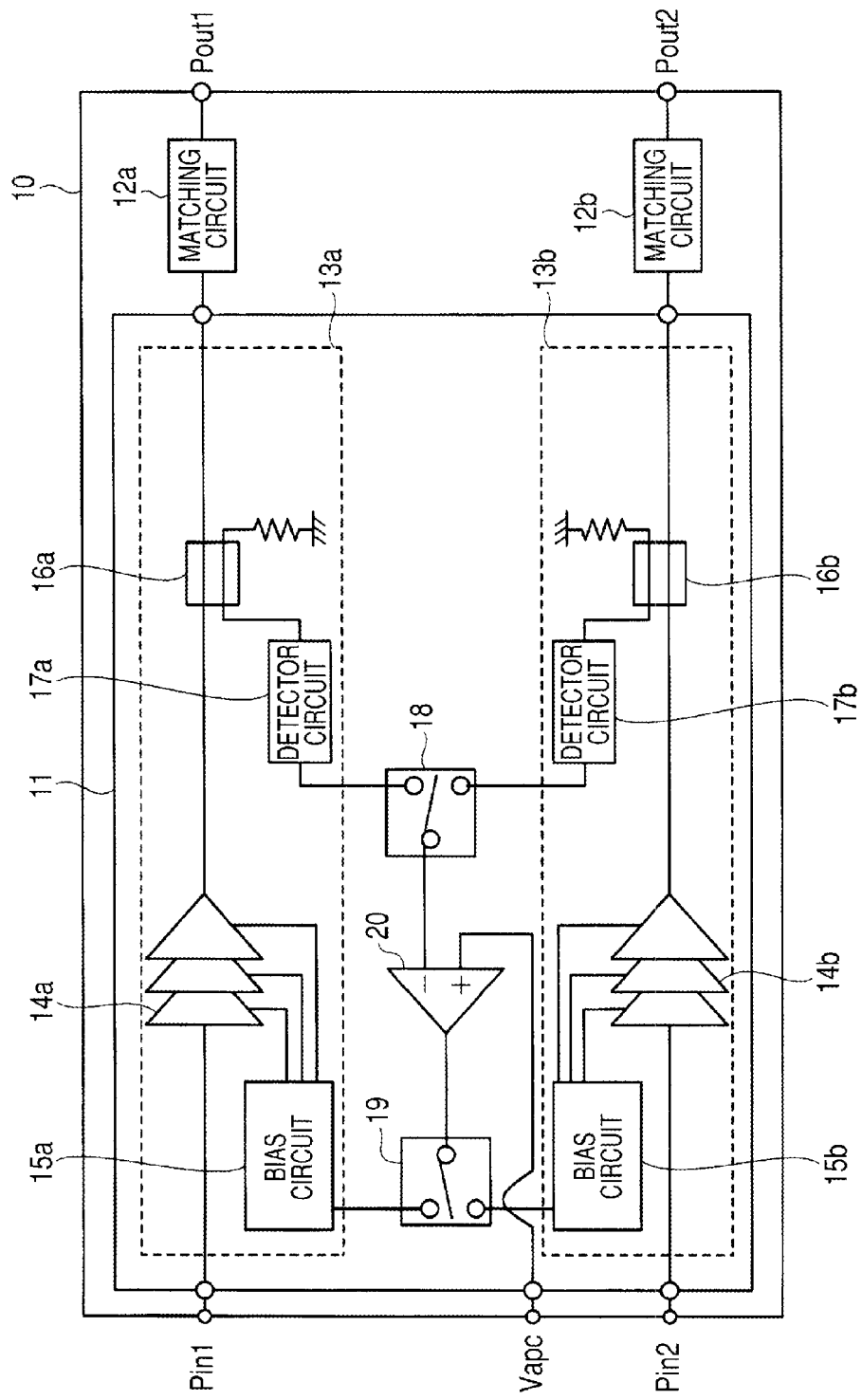
FIG. 2 is a circuit block diagram of a radio frequency amplifier circuit in an RF power module.

As described above, when a signal is transmitted from the digital mobile phone, the signal is amplified by the RF power module 5. Next, the configuration of the RF power module is described. FIG. 2 shows a circuit block of an RF amplifier circuit in the RF power module in the first embodiment. With reference to FIG. 2, the circuit block of the RF amplifier circuit is described.

In FIG. 2, an RF amplifier circuit formed in the RF power module 5 includes a semiconductor chip 11 and matching circuits 12a, 12b mounted on the mounting substrate 10. Then, an amplifier circuit 13a and an amplifier circuit 13b are formed in the semiconductor chip 11. The amplifier circuit 13a utilizes a first frequency and is adapted to be capable of amplifying a signal using 824 MHz to 915 MHz in the GSM low frequency band by utilizing the GSM (Global System for Mobile Communication) system. The amplifier circuit 13b utilizes a second frequency and is adapted to be capable of amplifying a signal using 1,710 MHz to 1,910 MHz in the GSM high frequency band. As described above, in the present first embodiment, the semiconductor chip 11 is adapted to be capable of amplifying signals in different two frequency bands.

The amplifier circuit 13a has an amplifier part 14a, a bias circuit 15a, a directional coupler 16a, and a detector circuit 17a. Similarly, the amplifier circuit 13b has an amplifier part 14b, a bias circuit 15b, a directional coupler 16b, and a detector circuit 17b. In addition, inside the semiconductor chip 11, band-switching switches 18, 19 and a differential amplifier 20 are formed.

The amplifier part 14a is an amplifier that amplifies an input signal in the GSM system low frequency band input from a terminal Pin 1 and includes, for example, three amplifier stages. Similarly, the amplifier part 14b is an amplifier that amplifies an input signal in the GSM system high frequency band input from a terminal Pin 2 and includes, for example, three amplifier stages.

The bias circuit 15a is configured to control an amplification degree by applying a bias voltage to the amplifier part 14a in accordance with a power control voltage input from a terminal Vapc, serving as a control circuit. Similarly, the bias circuit 15b is configured to control an amplification degree by applying a bias voltage to the amplifier part 14b in accordance with a power control voltage input from the terminal Vapc, serving as a control circuit.

The directional couplers 16a, 16b are configured to be capable of detecting the power of a signal amplified in the amplifier parts 14a, 14b and one of the characteristics of the present first embodiment lies in that the directional couplers 16a, 16b are formed inside the semiconductor chip 11. In other words, in the prior art, the directional couplers 16a, 16b are formed on the mounting substrate 10 that mounts the semiconductor chip 11 along with the matching circuits 12a, 12b, however, in the present first embodiment, the directional couplers 16a, 16b are formed inside the semiconductor chip 11. Due to this, it is no longer necessary to reserve a space for mounting the directional couplers 16a, 16b on the mounting substrate 10, and thus making it possible to miniaturize the mounting substrate 10.

The detector circuits 17a, 17b are configured to convert power detected by the directional couplers 16a, 16b into a voltage or current and output it to the differential amplifier 20.

The band-switching switches 18, 19 are configured to switch operations between the amplifier part 14a that amplifies a signal in the GSM system low frequency band and the amplifier part 14b that amplifies a signal in the GSM system high frequency band and are controlled by a band-switching signal, not shown schematically.

The differential amplifier 20 is configured to detect a difference between a power control voltage input from the terminal Vapc and a voltage output from the detector circuits 17a, 17b. The above circuits are those formed inside the semiconductor chip 11 and the matching circuits 12a, 12b are formed on the mounting substrate 10 outside the semiconductor chip 11. The impedances of the matching circuits 12a, 12b are adjusted using a passive element so that a signal amplified by the amplifier circuits 13a, 13b can be efficiently output without being reflected. In other words, the matching circuits 12a, 12b are configured to match the impedance with a signal output from the amplifier circuits 13a, 13b, respectively. Specifically, the matching circuits 12a, 12b are formed using resistive elements, capacitive elements, inductive elements, etc.

The RF amplifier circuit in the present first embodiment is configured as described above, and its operations are described below. In the present first embodiment, the circuit is configured to be capable of amplifying signals in the GSM system low frequency band and high frequency band, however, since the operations are the same, the operation when amplifying a signal in the low frequency band is described. In addition, although the communication system is described about the GSM system, other communication systems may be used.

First, the band-switching switches 18, 19 are switched to operate the amplifier circuit 13a by a band-switching signal. Then, an input signal input from the terminal Pin1 is input to the amplifier part 14a. A power control voltage is input from the terminal Vapc to the bias circuit 15a and the bias circuit 15a applies a bias voltage to the amplifier part 14a based on the power control voltage. As a result, the amplifier part 14a amplifies the input signal based on the bias voltage from the bias circuit 15a and outputs the signal. The signal amplified in the amplifier part 14a is output from the semiconductor chip 11 and input to the matching circuit 12a mounted on the mounting substrate 10. Since the impedance of the matching circuit 12a is matched, the amplified signal is efficiently output from a terminal Pout1 without being reflected. In this manner, a desired signal is output from the terminal Pout1.

It is desirable that the power of a signal output from the terminal Pout1 be constant. However, the power of a signal actually output is not necessarily the desired power due to external influences etc. Because of this, a circuit is provided, which controls the output power by feeding back the power to the bias circuit 15a that controls the amplifier part 14a. The operation of the feedback circuit is described. The power of a signal amplified in the amplifier part 14a is detected by the directional coupler 16a provided between the amplifier part 14a and the matching circuit 12a. The power detected in the directional coupler 16a is converted into a voltage in the detector circuit 17a coupled to the directional coupler 16a. The voltage converted in the detector circuit 17a is input to the differential amplifier 20. On the other hand, the power control voltage input from the terminal Vapc is also input to the differential amplifier 20. Then, in the differential amplifier 20, a difference between the voltage converted in the detector circuit 17a and the power control voltage is detected. Next, the magnitude of the bias voltage to be applied to the amplifier part 14a from the bias circuit 15a is controlled so that the difference detected in the differential amplifier 20 is canceled. Due to this, the power of the signal output from the terminal Pout 1 becomes constant. In this manner, the RF amplifier circuit formed in the RF power module operates.

Figure 3:
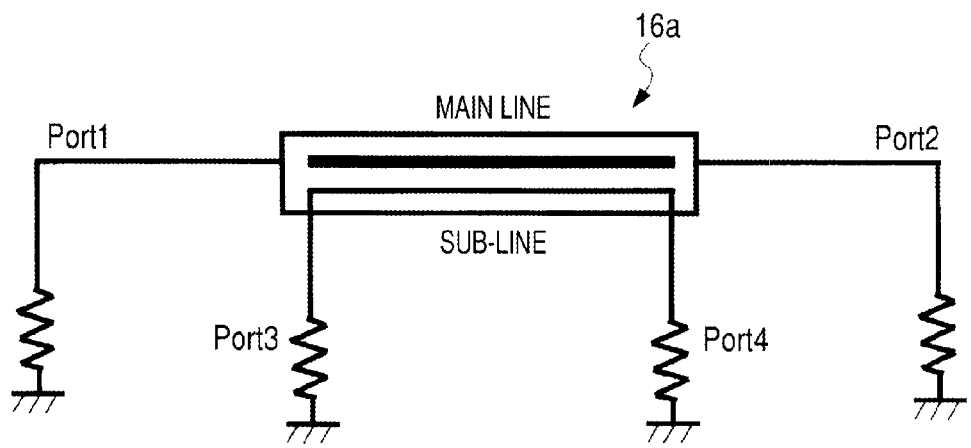
FIG. 3 is a diagram for illustrating a directional coupler.

Next, the directional coupler 16a is described. FIG. 3 is a schematic diagram showing a configuration of the directional coupler 16a. As shown in FIG. 3, the directional coupler 16a includes a wire constituting a main line and a wire constituting a sub-line. The directional coupler 16a is a four-terminal element and detects power propagating through the main line by the electromagnetically coupled sub-line. To this end, the main line and the sub-line are arranged in parallel to each other and configured so that no conductor exists between the main line and the sub-line.

Indicators of the performance of the directional coupler 16a include degree of coupling and directionality. The degree of coupling indicates the ratio of the power propagating through the main line to the power detected in the sub-line, and the greater the degree of coupling, the greater the power detected in the sub-line relative to the power propagating through the main line. It is possible to improve the degree of coupling of the directional coupler 16a by increasing the lengths of the main line and the sub-line arranged in parallel to each other and reducing the distance between the main line and sub-line.

Subsequently, the directionality of the directional coupler 16a is described. As shown in FIG. 3, let one end of the main line be denoted by Port 1 and the other be denoted by Port 2. In addition, let one end of the sub-line be denoted by Port 3 and the other be denoted by Port 4. Here, it is assumed that the power (RF signal) propagates through the main line from Port 1 to Port 2. In other words, from the correspondence with FIG. 2, Port 1 of the main line is coupled with the amplifier circuit 14a and Port 2 of the main line is coupled with the matching circuit 12a. If impedance matching by the matching circuit 12a is not accomplished, the power that propagates from Port 1 toward Port 2 of the main line and the power that is reflected from the Port 2 side and propagates from Port 2 toward Port 1 coexist mixedly, as a result. In the actual circuit, however, impedance matching is accomplished by the matching circuit 12a, and therefore, it can be thought that the power that is reflected from the Port 2 side and propagates from Port 2 toward Port 1 does not exist. In other words, only the power that propagates from Port 1 to Port 2 exists in the main line, as a result.

As described above, due to the electromagnetic coupling of the power that propagates through the main line, power is generated in the sub-line, and the electromagnetic coupling includes electric field coupling and magnetic field coupling. The electric field coupling between the main line and the sub-line occurs resulting from the capacitance between the main line and the sub-line and the power detected in the sub-line due to the electric field coupling propagates through the sub-line toward Port 3 and toward Port 4 evenly. In other words, the power resulting from the electric filed coupling has no directionality. On the other hand, the magnetic field coupling between the main line and the sub-line occurs resulting from an electromagnetic induction phenomenon between the main line and the sub-line, and therefore, the power detected as a result of the magnetic field coupling appears in the direction of canceling the generated magnetic field. In other words, the power resulting from the magnetic field coupling propagates in a specific direction. As a result, when the power that propagates through the sub-line toward Port 4 due to the electric field coupling is balanced with the power that propagates through the sub-line toward Port 3 due to the magnetic field coupling, power is no longer generated at Port 4 of the sub-line. In this manner, when configured so that the power resulting from the electric field coupling is balanced with the power resulting from the magnetic field coupling at Port 4 of the sub-line, only the power that propagates through the sub-line toward Port 3 is detected. Due to this, the directional coupler 16a that detects only the power that propagates in a specific direction can be realized.

Here, in order to configure such that the power resulting from the electric field coupling is balanced with the power resulting from the magnetic field coupling at Port 4 of the sub-line, Port 4 of the sub-line is coupled with the GND potential via predetermined passive elements (resistors, capacitors, inductors). Making a selection so that the impedances of the passive elements have predetermined values makes it possible to balance the power resulting from the electric field coupling with the power resulting from the magnetic field coupling at Port 4 of the sub-line.

According to the directional coupler 16a configured as described above, the detected power propagates through the sub-line toward Port 3. This power is converted into, for example, a voltage in the detector circuit 17a shown in FIG. 2. In other words, Port 3 of the directional coupler 16a is electrically coupled with the detector circuit 17a. Next, an example of the circuit configuration of the detector circuit 17a is described.

Figure 4:
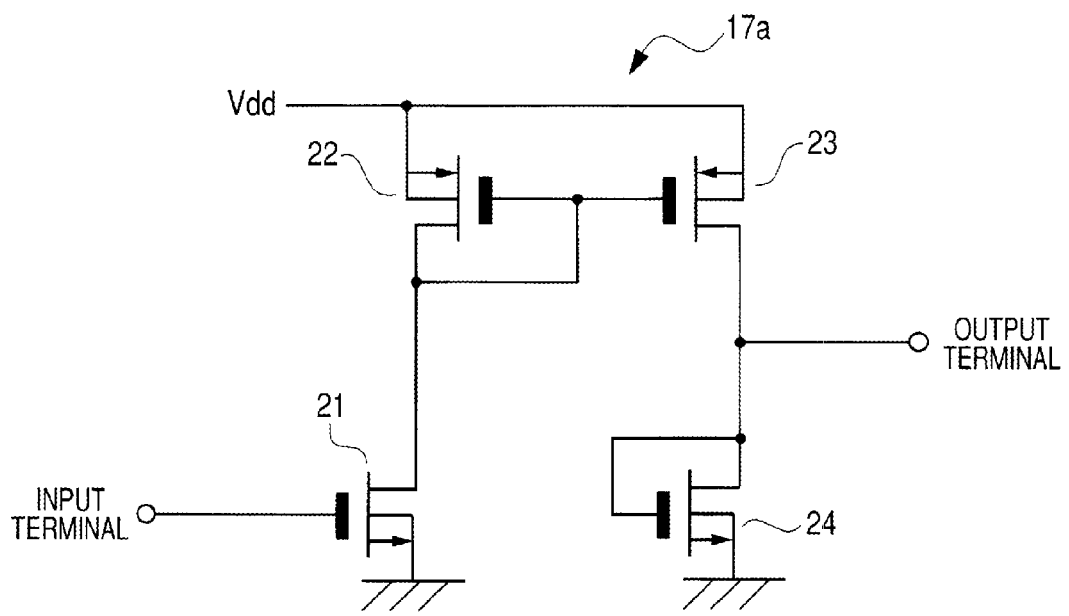
FIG. 4 is a circuit diagram showing an example of a detector circuit.

FIG. 4 is a diagram showing a circuit configuration example of the detector circuit 17a. In FIG. 4, the detector circuit 17a has n-channel type MOSFETs (Metal Insulator Semiconductor Field Effect Transistors) 21, 24 and p-channel type MOSFETs 22, 23. The n-channel type MOSFET 21 and the p-channel type MOSFET 22 are coupled in series between the GND potential and the power supply potential (Vdd). Further, between the GND potential and the power supply potential, the p-channel type MOSFET 23 and the n-channel type MOSFET 24 coupled in series are coupled to be in parallel with the n-channel type MOSFET 21 and the p-channel type MOSFET 22 coupled in series.

The gate electrode of the p-channel type MOSFET 22 and the gate electrode of the p-channel type MOSFET 23 are coupled and these gate electrodes are coupled with the drain region of the p-channel type MOSFET 22. Due to this, the p-channel type MOSFET 22 and the p-channel type MOSFET 23 constitute a current mirror circuit. In addition, the gate electrode of the n-channel type MOSFET 24 is electrically coupled with the drain region of the n-channel type MOSFET 24.

The operation of the detector circuit 17a configured in this manner is described. First, the power (RF signal) detected by the directional coupler is input to the input terminal of the detector circuit 17a. The power input to the input terminal of the detector circuit 17a is input to the gate electrode of the n-channel type MOSFET 21. Then, a current corresponding to the amplitude of the power input to the gate electrode flows between the source region and the drain region of the n-channel type MOSFET 21. At this time, due to the current mirror circuit constituted by the p-channel type MOSFET 22 and the p-channel type MOSFET 23, a current, the same amount of the current that flows between the source region and the drain region of the n-channel type MOSFET 21, flows also between the source region and the drain region of the n-channel type MOSFET 24. As a result, a voltage, which is required to cause the same amount of current to flow in the source region and the drain region of the n-channel type MOSFET 24, is generated at the output terminal of the detector circuit 17a. The power detected by the directional coupler can be converted into a voltage using the detector circuit 17a.

Figure 5:
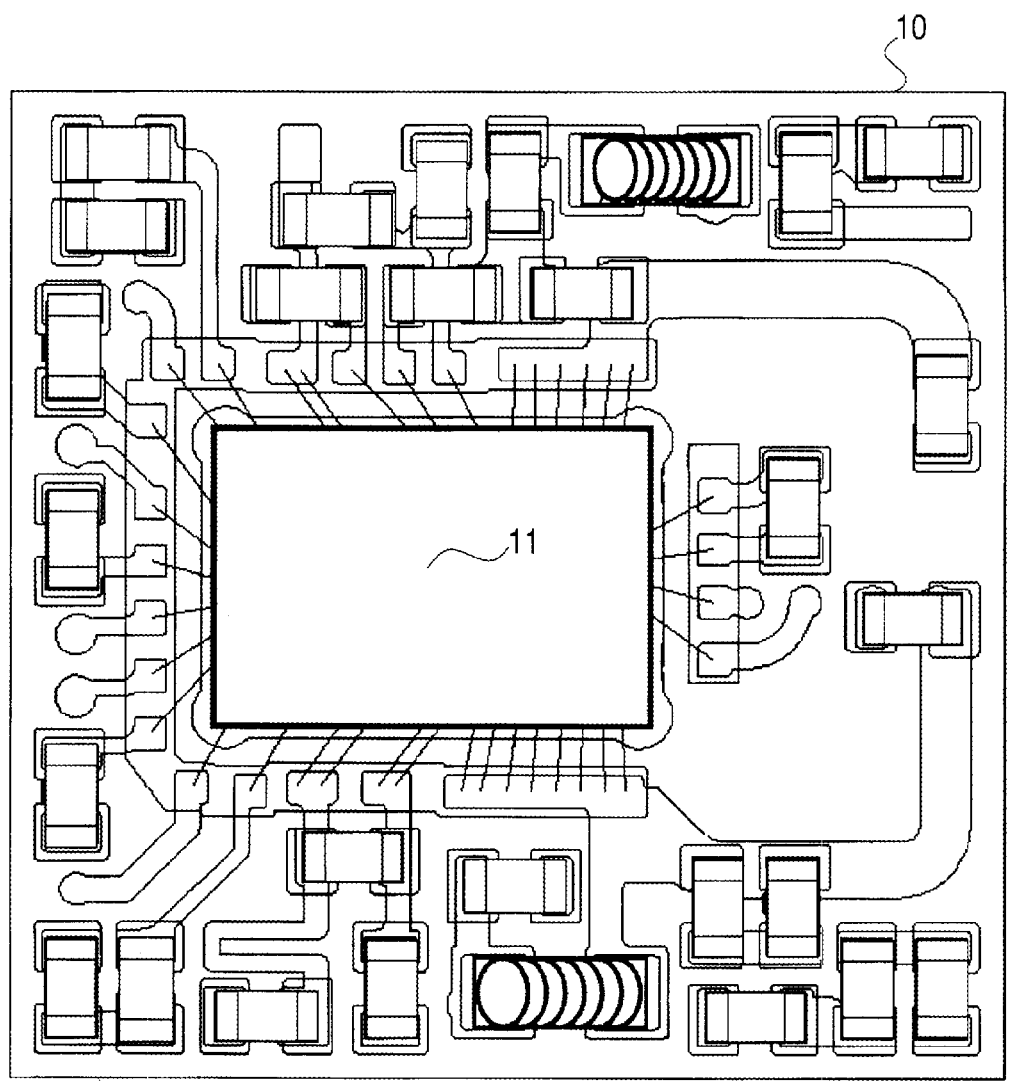
FIG. 5 is a plan view showing a mounting configuration of an RF power module.

Next, the mounting configuration of the RF power module in the present first embodiment is described. FIG. 5 is a plan view showing the mounting configuration of the RF power module in the present first embodiment. As shown in FIG. 5, in the RF power module in the present first embodiment, the semiconductor chip 11 and the passive parts are mounted on the mounting substrate (wiring substrate) 10. The mounting substrate 10 includes, for example, a printed wiring substrate and has a structure in which a plurality of dielectric layers (insulating layers) is bonded to one another. On the surface (main surface) and the undersurface of, and inside the mounting substrate 10, predetermined wires are formed and part of the wires formed on the surface of the mounting substrate 10 and part of the wires formed on the undersurface of the mounting substrate 10 are electrically coupled through the via formed in the thickness direction of the mounting substrate 10.

The semiconductor chip 11 includes silicon as a principal component and on the silicon substrate, the amplifier circuits 13a, 13b, the band-switching switches 18, 19, the differential amplifier 20, etc., shown in FIG. 2 are formed. The components constituting the amplifier circuits 13a, 13b include the amplifier parts 14a, 14b, the bias circuits 15a, 15b, the directional couplers 16a, 16b, the detector circuits 17, 17b, etc.

The amplifier parts 14a, 14b include, for example, three amplifier stages and each amplifier stage is formed by the LDMOSFET formed on the silicon substrate. The bias circuits 15a, 15b, the detector circuits 17a, 17b, the band-switching switches 18, 19 and the differential amplifier 20 are formed by the MOSFETs etc. formed on the silicon substrate.

The semiconductor chip 11 has a rectangular shape and a plurality of boding pads (not shown) is formed along the periphery. These bonding pads and the terminals formed on the mounting substrate 10 are coupled by wires etc.

The passive parts formed on the mounting substrate 10 include, for example, chip parts, including resistors, inductance elements, capacitors, etc. These passive parts are electrically coupled with the wires formed on the surface of the wiring substrate. The passive parts constitute, for example, the matching circuits 12a, 12b etc. shown in FIG. 2, for example.

Figure 32:
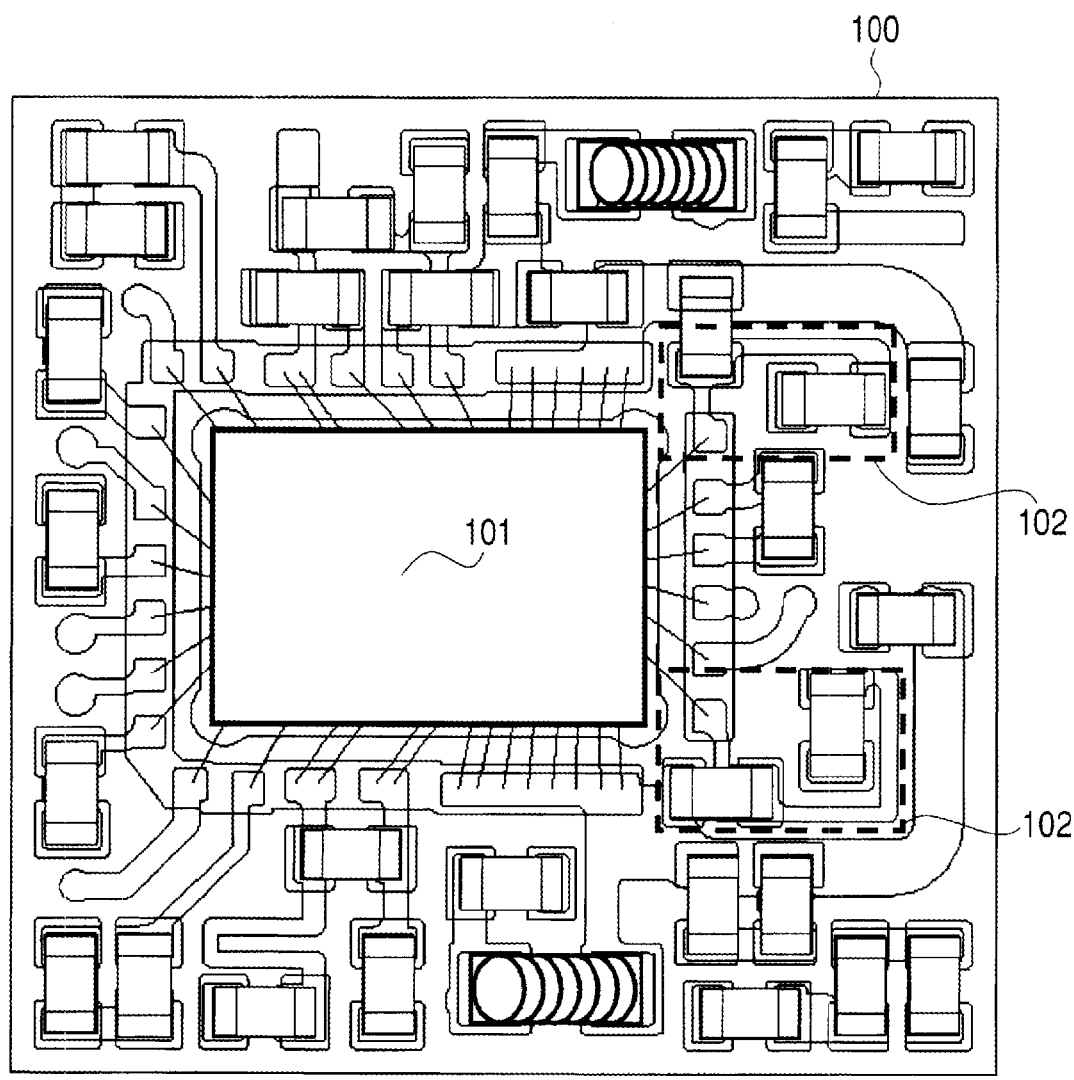
FIG. 32 is a top view showing a mounting configuration of an RF power module the present inventors have discussed.

Here, one of the characteristics in the present first embodiment lies in that the directional couplers 16a, 16b are provided inside the semiconductor chip 11. In other words, in the present first embodiment, the directional couplers 16a, 16b are formed on the silicon substrate constituting the semiconductor chip 11. Conventionally, as shown in FIG. 32, a directional coupler 102 is mounted on a mounting substrate 100 outside a semiconductor chip 101, not inside the semiconductor chip 101. Because of this, it is necessary to reserve a region to mount the directional coupler 102 on the mounting substrate 100, and this is the bottleneck to the miniaturization of the mounting substrate 100. In particular, in the RF power module in which signals in different frequency bands are amplified, because it is necessary to mount a plurality of the directional couplers 102, the area of the mounting substrate 100 occupied by the directional coupler 102 is increased.

In contrast to this, in the present first embodiment, as shown in FIG. 5, the directional coupler is formed inside the semiconductor chip 11, and therefore, it is no longer necessary to reserve a region to mount the directional coupler on the mounting substrate 10. Specifically, as can be seen from the comparison between FIG. 5 and FIG. 32, in FIG. 5, the region on the mounting substrate 10 to mount the directional coupler is an empty space. As a result, it is made possible to miniaturize size of the mounting substrate 10 by omitting the empty space shown in FIG. 5. In other words, it is no longer necessary to reserve a region to mount the directional coupler on the mounting substrate 10, and there remains a free space. Therefore, the degree of freedom to arrange the passive elements to be mounted on the mounting substrate 10 increases. For example, the matching circuit is mounted on the mounting substrate 10 outside the semiconductor chip 11 and also for the arrangement of the matching circuit, the degree of freedom increases. Further, the detector circuit is coupled to the directional coupler in order to convert the power detected by the directional coupler into a voltage or current. The detector circuit is normally formed inside the semiconductor chip 11 using the MOSFET etc., and therefore, when mounting the directional coupler on the mounting substrate 10 outside the semiconductor chip 11, it is necessary to couple the semiconductor chip 11 and the directional coupler mounted on the mounting substrate 10 using a wire to couple the directional coupler and the detector circuit. However, in the present first embodiment, the configuration is designed so that the directional coupler is formed inside the semiconductor chip 11 like the detector circuit, and therefore, it is possible to omit the configuration for coupling the semiconductor chip and the wire on the mounting substrate 10 using a wire, in order to couple the directional coupler and the detector circuit.

As described above, in the present first embodiment, one of the characteristics lies in that the directional coupler is formed inside the semiconductor chip 11, and next, the internal configuration of the semiconductor chip 11 in which the directional coupler is formed is described.

Figure 6:
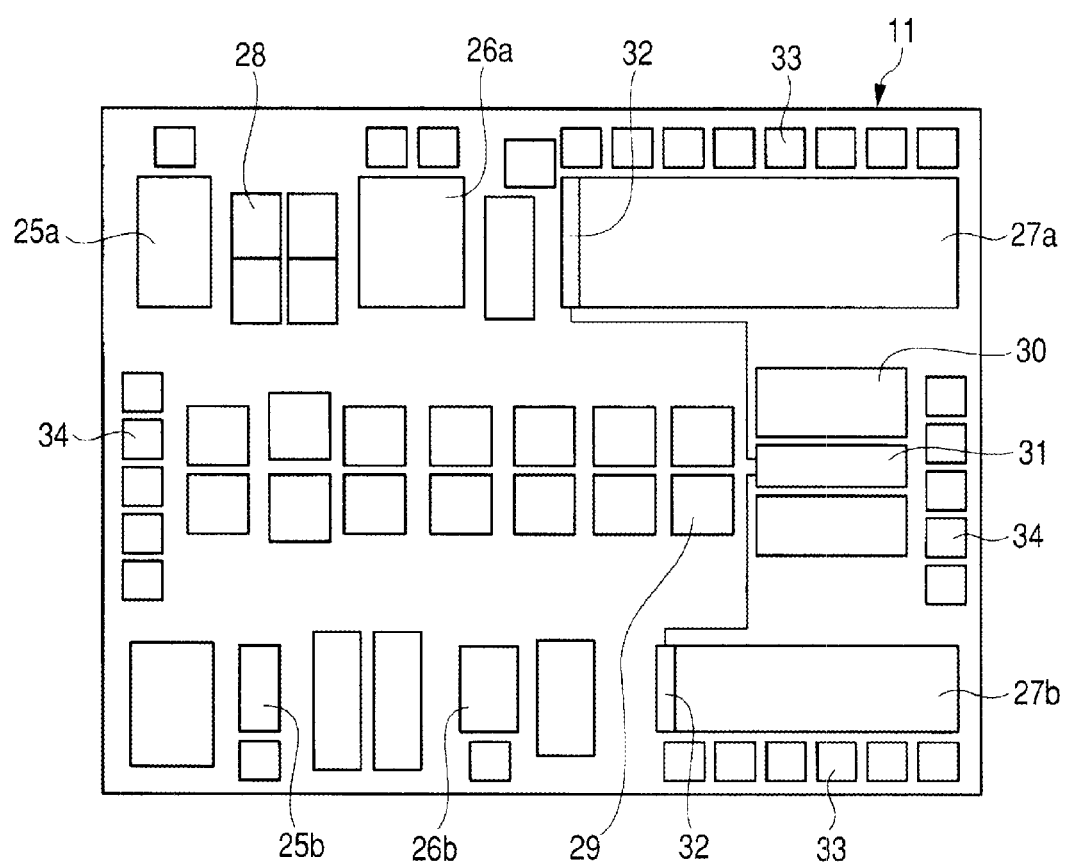
FIG. 6 is a top view showing a layout configuration of a semiconductor chip.

FIG. 6 is a top view showing a layout configuration of the semiconductor chip 11. As shown in FIG. 6, the semiconductor chip 11 has a rectangular shape and elements are formed in the rectangular internal region. For example, a three-stage amplifier that constitutes the low frequency amplifier part for the GSM system (the amplifier part 14a in FIG. 2) is formed. As a first stage of the three-stage amplifier, a first stage amplifier 25a is formed and as a second stage, an intermediate stage amplifier 26a is formed. Then, as a final stage, a final stage amplifier 27a is formed. Similarly, in the semiconductor chip 11, a three-stage amplifier that constitutes the high frequency amplifier part for the GSM system (the amplifier part 14b in FIG. 2) is formed. Specifically, as a first stage, a first stage amplifier 25b is formed and as a second stage, an intermediate stage amplifier 26b is formed. As a final stage, a final stage amplifier 27b is formed. These amplifier parts are formed by a plurality of LDMOSFETs coupled in parallel and the LDMOSFETs realize the amplifier function.

In the semiconductor chip 11, capacitive elements 28 and resistive elements 29 are also formed. Further, a control circuit (the bias circuits 15a, 15b, etc. in FIG. 2) 30 that controls the amplifier part is formed and the control circuit 30 is formed by, for example, a CMOS (Complementary MOS) etc. Inside the semiconductor chip 11, a detector circuit (the detector circuits 17a, 17b in FIG. 2) 31 is also formed. The detector circuit 31 is also formed by a MOSFET etc. The detector circuit 31 is coupled with a sub-line 32 of the directional coupler by the wire formed inside the semiconductor chip 11. In other words, in the present first embodiment, inside the semiconductor chip 11, the directional coupler is formed and the sub-line 32 constituting the directional coupler is formed. The sub-line 32 is formed on the final stage amplifiers 27a, 27b. On the other hand, although the main line constituting the directional coupler is not shown in FIG. 6, its configuration is such that the drain wire of the final stage amplifiers 27a, 27b is shared. In this manner, the directional coupler is formed in the semiconductor chip 11.

On the periphery of the semiconductor chip 11, a pad 33 is formed that outputs the power amplified by the final stage amplifiers 27a, 27b constituting the final stage of the amplifier part to the outside of the semiconductor chip 11. In addition, on the periphery of the semiconductor chip 11, a pad 34 is also formed that inputs a control signal (power control voltage etc.).

Figure 7:
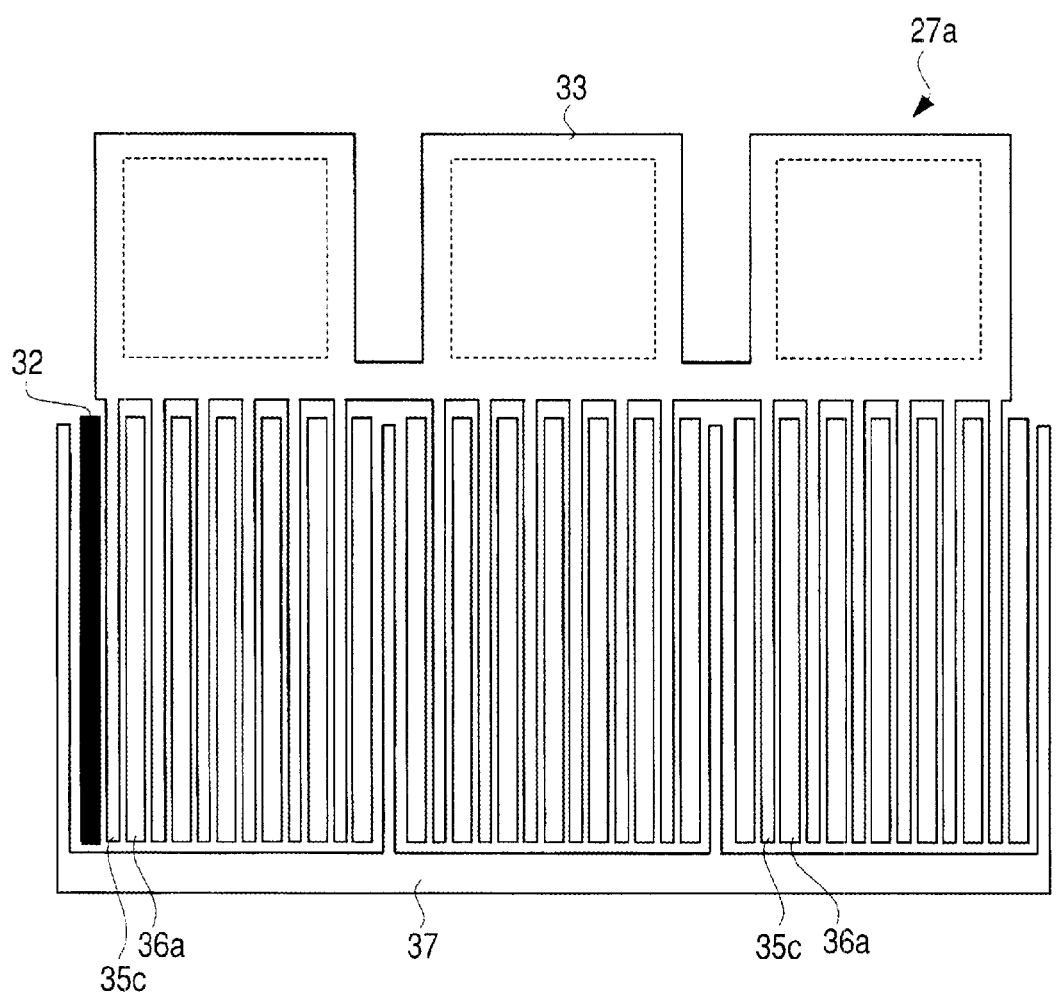
FIG. 7 is a top view showing a layout configuration of a final amplifier.

Next, the configuration of the final stage amplifier 27a in which the directional coupler is formed is described. The final stage amplifier 27a is configured by a plurality of LDMOS-FETs. FIG. 7 is a top view showing the layout configuration of the final stage amplifier 27a formed in the semiconductor chip 11 shown in FIG. 6. As shown in FIG. 7, in the final stage amplifier 27a, a plurality of drain wires 35c and a plurality of source wires 36a extend in a predetermined direction. The drain wires 35c and the source wires 36a are arranged by turns in parallel to each other. The drain wire 35c is coupled to the drain region of the LDMOSFET constituting the final stage amplifier 27a and the source wire 36a is coupled to the source region of the LDMOSFET constituting the final stage amplification part 27a. In addition, in the final stage amplifier 27a, a gate wire 37 is formed and the gate wire 37 is coupled to the gate electrode of the LDMOSFET constituting the final stage amplifier 27a. In the final stage amplifier 27a having such a layout configuration, the sub-line 32 constituting the directional coupler is formed. The sub-line 32 is arranged in parallel to one of the drain wires 35c with a predetermined distance. The drain wire 35c neighboring the sub-line 32 also serves as the main line of the directional coupler. In other words, the formation of the directional coupler in the final stage amplifier 27a can be realized by providing the sub-line 32 in parallel to one of the drain wires 35c through which the amplified power propagates.

The final stage amplifier 27a constitutes the final stage of the three-stage amplifier and the power amplified by the final stage amplifier 27a is output to the outside of the semiconductor chip from the pad (drain pad) 33. Because of this, the directional coupler is formed in the final stage amplifier 27a in order to detect the finally amplified power. In other words, in the first stage amplifier and the intermediate stage amplifier, the power is not the one which is output finally from the RF power module but just the one which is still in the amplification process, and therefore, the directional coupler that detects the finally amplified power is not formed therein.

Figure 8:
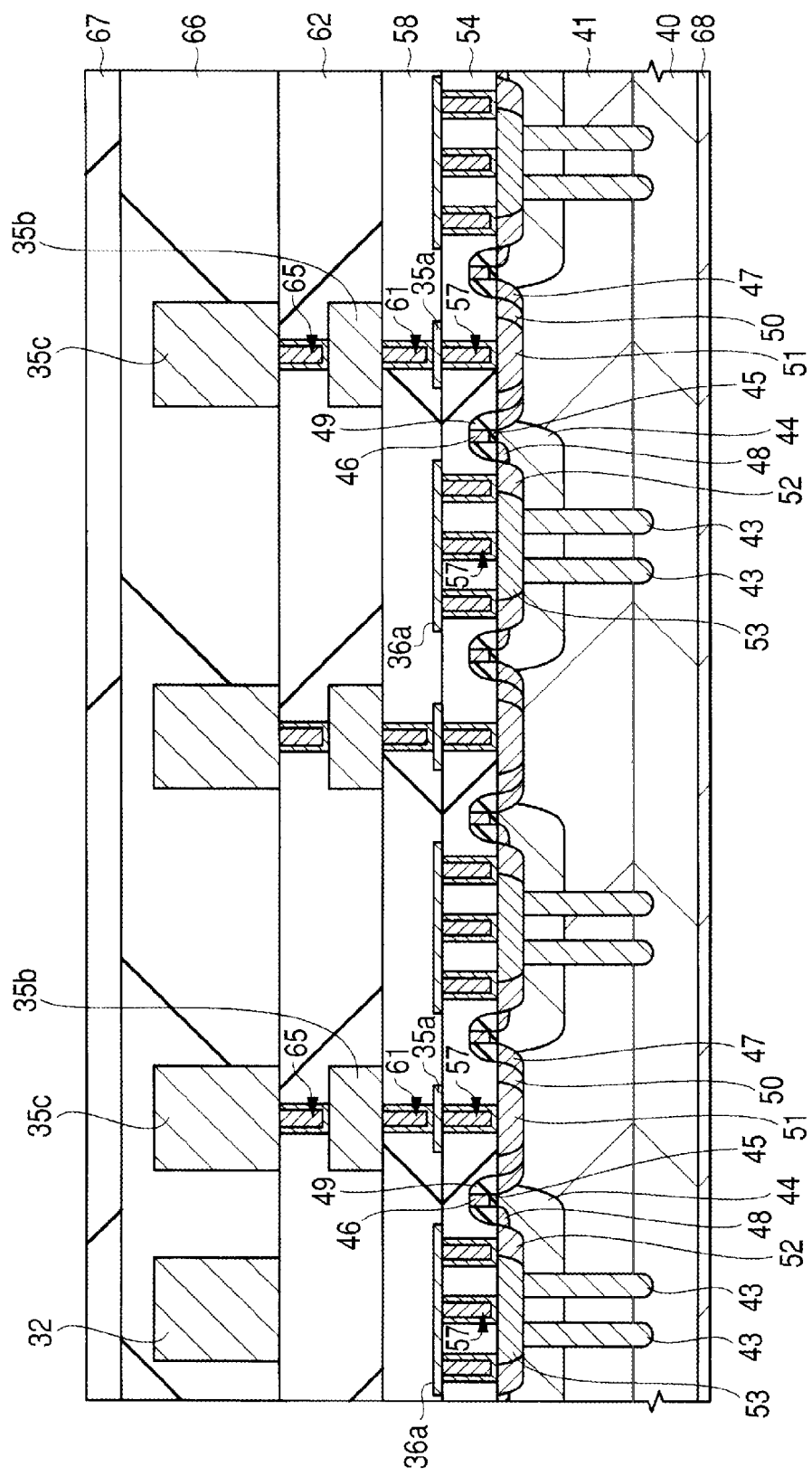
FIG. 8 is a cross-sectional view showing a partial section of a final amplifier including a directional coupler.

FIG. 8 is a cross-sectional view showing a partial section of the final stage amplifier 27a including the directional coupler. In the cross-sectional view shown in FIG. 8, the directional coupler and the LDMOSFETs are shown. In FIG. 8, on a semiconductor substrate 40 including silicon single crystal into which p-type impurities, such as boron (B), have been introduced, a p-type epitaxial layer 41, which is a semiconductor layer into which p-type impurities have been introduced, is formed and in the p-type epitaxial layer 41, a p-type punched layer 43 into which p-type impurities have been introduced in a high concentration is formed. The resistance of the p-type punched layer 43 is reduced by the introduction of p-type impurities in a high concentration. The p-type punched layer 43 is formed by embedding a polysilicon film into which p-type impurities have been introduced in a high concentration, however, it may also be possible to embed a metal film (for example, a W (tungsten) film) instead of the polysilicon film, and in this case, it is possible to form a punched layer with a further smaller parasitic resistance.

Then, in the p-type epitaxial layer 41, a p-type well 44 is formed. The p-type well 44 is formed mainly in the source formation region and the channel formation region of the LDMOSFET. On the channel formation region of the p-type epitaxial layer 41, a gate insulating film 45 is formed and on the gate insulating film 45, a gate electrode 46 is formed. On the sidewalls on both sides of the gate electrode 46, sidewalls 49 are formed.

Below one of the sidewalls 49 formed on the sidewalls on both sides of the gate electrode 46, an $n^-$-type offset drain region (drain low concentration region) 47 is formed. The $n^-$-type offset drain region 47 is terminated at the lower part of the sidewall of the gate electrode 46 so that its end comes into contact with the channel formation region. On the outside of the $n^-$-type offset drain region 47, an n-type offset drain region (drain high concentration region) 50 is formed and on the outside of the n-type offset drain region 50, an $n^+$-type drain region (drain high concentration region) 51 is formed, the impurity concentration of which is higher than that of the n-type offset drain region 50 and which is more distant from the channel formation region than the n-type offset drain region 50. The $n^-$-type offset drain region 47, the n-type offset drain region 50, and the $n^+$-type drain region 51 form the drain region of the LDMOSFET.

On the other hand, below the other of the sidewalls 49 formed on the sidewalls on both sides of the gate electrode 46, an $n^-$-type source region 48 is formed. The $n^-$-type source region 48 is terminated at the lower part of the sidewall of the gate electrode 46 so that its end comes into contact with the channel formation region. On the outside of the $n^-$-type source region 48, an $n^+$-type source region 52 is formed, the impurity concentration of which is higher than that of the $n^-$-type source region 48 and the position of the bottom of which is deeper than that of the $n^-$-type source region 48. The $n^-$-type source region 48 and the $n^+$-type source region 52 form the source region of the LDMOSFET.

Further, on the outside of the $n^+$-type source region 52, a $p^+$-type semiconductor region 53 is formed. The $p^+$-type semiconductor region 53 is coupled with the p-type punched layer 43 and has a function of reducing the resistance of the surface of the p-type punched layer 43. In this manner, on the main surface of the semiconductor substrate 40, the LDMOSFET is formed. As shown in FIG. 8, on the main surface of the semiconductor substrate 40, a plurality of LDMOSFETs having the above-described configuration is formed.

Subsequently, the wire structure coupled to the LDMOSFET formed on the semiconductor substrate 40 is described. As shown in FIG. 8, on the LDMOSFET formed on the semiconductor substrate 40, a silicon oxide film 54, which will serve as an interlayer insulating film, is formed and in the silicon oxide film 54, a plurality of plugs 57 that penetrate through the silicon oxide film 54 is formed. Among the plugs, part of the plugs 57 is coupled to the $n^+$-type drain region 51 and the other part is coupled to the $n^+$-type source region 52 or the $p^+$-type semiconductor region 53.

The plug 57 coupled to the $n^+$-type drain region 51 is coupled to a drain wire 35a formed on the plug 57. Then, on the drain wire 35a, a silicon oxide film 58, which will serve as an interlayer insulating film, is formed and a plug 61 is formed in the silicon oxide film 58. The plug 61 is electrically coupled with the drain wire 35a. Further, on the plug 61, a drain wire 35b is formed and on the drain wire 35b, a silicon oxide film 62, which will serve as an interlayer insulating film, is formed. In the silicon oxide film 62, a plug 65 is formed and on the plug 65, the drain wire 35c is formed. In this manner, on the n+-type drain region 51 constituting part of the drain region of the LDMOSFET, the three-layer wire is formed. Specifically, the n+-type drain region 51 is coupled to the drain wire 35a, which is a first wire layer, via the plug 57 and the drain wire 35a is coupled to the drain wire 35b, which is a second wire layer, via the plug 61. The drain wire 35b, which is the second wire layer, is coupled to the drain wire 35c, which is a third layer wire, via the plug 65. The drain wire 35c formed in the uppermost layer is coupled to the pad (drain pad) 33, as shown in FIG. 7.

On the other hand, the plug 57 to be coupled to the n+-type source region 52 and the plug 57 to be coupled to the p+-type semiconductor region 53 are coupled by the source wire 36a. In other words, the n+-type source region 52 and the p+-type semiconductor region 53 are coupled by the source wire 36a via the plug 57. Here, no multilayer wire layer is formed on the source wire 36a. In the present first embodiment, the drain wire has the three-layer wire structure but the source wire has the single layer wire structure. This will be described.

In the present first embodiment, the p-type punched layer is formed by a p-type polysilicon film with a low resistance into which impurities have been introduced in a high concentration or a metal film with a low resistance. Because of this, the source wire that electrically couples the source regions (the n+-type source region 52 and the p+-type semiconductor region 53) of the base cell of the LDMOSFET in order to substantially reduce the parasitic resistance of the p-type punched layer 43 is used only for the source wire 36a, which is the first wire layer, and no source wire has to be formed on the upper layer than the source wire 36a. In other words, the number of wire layers (one layer) that forms the source wire is smaller than the number of wire layers (three layers) that form the drain wire. Due to this, it is possible to considerably reduce the parasitic capacitance (output capacitance) between the drain wire and the source wire. In other words, if both the drain wire and the source wire have the three-layer wire structure, the parasitic capacitance between the drain wire and the source wire increases. Then, in the present first embodiment, in order to reduce the resistance of the p-type punched layer 43, the source wire that couples the n+-type source region 52 and the p+-type semiconductor region 53 is caused to have one layer by reducing the resistance of the p-type punched layer 43 itself rather than the source wire that couples the n+-type source region 52 and the p+-type semiconductor region 53 is caused to have the multilayer wire structure. Due to this, the effect to reduce the parasitic capacitance between the source wire and the drain wire can be obtained.

This is also one of advantages resulting from the use of the single layer structure of the source wire 36a as the source wire, however, in the present first embodiment, there is further an advantage in that a vacant region is formed on the source wire 36a. In other words, as shown in FIG. 8, the source wire, which would have the three-layer structure, is omitted, and the source wire 36a having the one-layer structure is used, and therefore, the region neighboring the drain wire 35c, which is the third layer, becomes vacant. In the present first embodiment, the sub-line 32 constituting the directional coupler is provided in the vacant region. In other words, if the source wire is caused to have the three-layer wire structure, no vacant region is produced in the same layer as that of the drain wire 35c and which neighbors the drain wire 35c, and therefore, it is not possible to form the sub-line 32 constituting the directional coupler in the same layer as that of the drain wire 35c. In contrast to this, in the present first embodiment, the source wire uses only one layer of the source wire 36a, and therefore, it is possible to form the sub-line 32 constituting the directional coupler in the same layer as that of the drain wire 35c, which is the third layer. The advantage that the sub-line 32 constituting the directional coupler is formed in the same layer as that of the drain wire 35c lies in that it is not necessary to drastically modify the manufacturing process. This is because, it is only necessary to modify part of the patterning that forms the drain wire 35c in order to form the sub-line 32 of the directional coupler in the same layer as that of the drain wire 35c, which will be described in the method of manufacturing the LDMOSFET later. As described above, according to the present first embodiment, it is possible to form the LDMOSTET and the directional coupler in the final stage amplifier 27a.

In addition, as shown in FIG. 8, on the sub-line 32 constituting the directional coupler and the drain wire 35c, a silicon oxide film 66, which will serve as an interlayer insulating film, is formed and on the silicon oxide film 66, a silicon nitride film 67, which will serve as a surface protective film, is formed. Further, on the surface in opposition to the main surface of the semiconductor substrate 40, a backside electrode 68 is formed. As a result, the backside electrode 68 is electrically coupled with the source region of the LDMOSFET. On the other hand, the drain region of the LDMOSFET is coupled to the pad 33 (refer to FIG. 7) via the drain wires 35a, 35b, 35c. Because of this, the power (RF signal) amplified in the LDMOSFET is finally output from the pad 33 through the drain wire 35c. At this time, by providing the drain wire 35c through which the amplified power propagates as the main line and the sub-line 32 formed in the same layer as that of the drain wire 35c, which will serve as the main line, the directional coupler is formed. Then, the power that propagates through the main line can be detected by the directional coupler.

As shown in FIG. 8, the sub-line 32 is provided in the same layer as that of the drain wire 35c, however, the drain wire 35c and the sub-line 32 are arranged in parallel with a predetermined distance in between. Between the drain wire 35c, which will serve as the main line, and the sub-line 32, no conductor is formed but the silicon oxide film 66, which is an insulator, is formed in order to realize the directional coupler. In addition, from the standpoint of improving the degree of coupling of the directional coupler, it is desirable to set the distance between the drain wire 35c, which will serve as the main line, and the sub-line 32 to not more than 2 μm.

It can be seen that the directional coupler can be formed inside the semiconductor chip by configuring as described above. Here, the fact is described below that the same performance when the directional coupler is provided outside the semiconductor chip as conventionally can be realized also when the directional coupler is provided inside the semiconductor chip.

Figure 9:
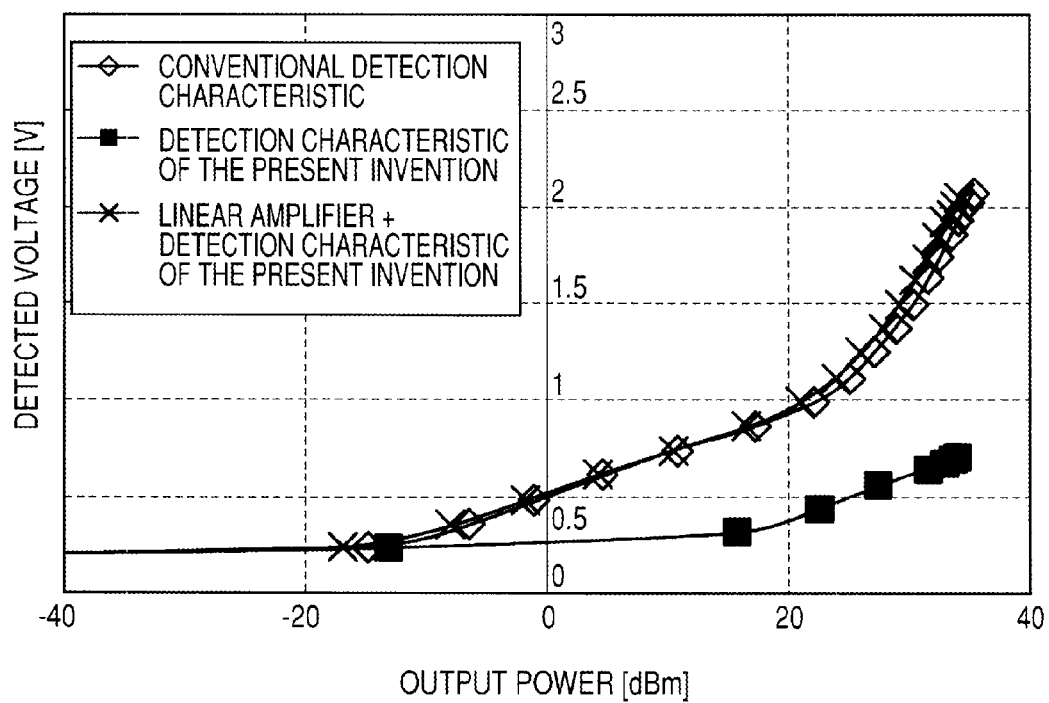
FIG. 9 is a graph showing a relationship between output power and detected voltage.

FIG. 9 is a graph showing a relationship between the output power and the detected voltage. The output power means the power amplified in the RF power module and output therefrom and the detected voltage means the output power detected in the directional coupler and converted into a voltage in the detector circuit. In FIG. 9, the horizontal axis represents the output power (dBm), indicating that the output power increases in the rightward direction. On the other hand, the vertical axis represents the detected voltage (V), indicating that the detected voltage increases in the upward direction. It is indicated that the higher the output power becomes, the higher the detected voltage becomes accordingly.

In FIG. 9, a comparison between the conventional detection characteristic and the detection characteristic of the present invention is shown. The conventional detection characteristic means the detection characteristic when a configuration in which the directional coupler is formed outside the semiconductor chip is employed and the detection characteristic of the present invention means the detection characteristic when a configuration in which the directional coupler is formed inside the semiconductor chip is employed. As shown in FIG. 9, when the output power is not more than −15 dB, there is no difference and the detected voltage is about 0.3 V. When the output power is not less than −15 dB, the detected voltage in the conventional configuration is higher than that in the configuration of the present invention. This is that the size of the directional coupler can be increased in the conventional configuration, and therefore, the main line and the sub-line can be lengthened and the degree of coupling can be improved. In contrast to this, the directional coupler is formed inside the semiconductor chip in the present invention, and therefore, it is not possible to lengthen the main line and the sub-line as is possible when the directional coupler is provided outside the semiconductor chip. The degree of coupling of the directional coupler increases with the increasing length of the main line and the sub-line, and therefore, the degree of coupling tends to decrease when the directional coupler is formed inside the semiconductor chip. However, as shown in FIG. 9, a detected voltage equal to or more than a fixed value can be obtained, and therefore, it is possible to sufficiently detect the output power even when the directional coupler is formed inside the semiconductor chip. Although the directionality of the directional coupler is not shown in FIG. 9, it has been confirmed that the directionality of the same level as that when the directional coupler is provided outside the semiconductor chip can be obtained.

When the directional coupler is formed inside the semiconductor chip, there may be a method of compensating for the degree of coupling, in which, a linear amplifier is inserted between the directional coupler and the detector circuit. In this case as shown in FIG. 9, the detected voltage can be amplified by the linear amplifier, and therefore, it can be seen that it is possible to obtain the detected voltage equivalent to that in the configuration in which the directional coupler is formed outside the semiconductor chip even in the configuration in which the directional coupler is formed inside the semiconductor chip. In other words, it can be seen that it is possible to improve the degree of coupling by inserting the linear amplifier between the directional coupler and the detector circuit. At this time, even if the linear amplifier is inserted, the directionality of the directional coupler will not deteriorate. In other words, the directionality of the directional coupler will not deteriorate due to the insertion of the linear amplifier because it is determined by the ratio between the incident wave and the reflected wave, and therefore, determined by the performance of the directional coupler. From this, it can be seen that the degree of coupling can be improved without deteriorating the directionality of the directional coupler by using the linear amplifier even when the directional coupler is provided inside the semiconductor chip.

The linear amplifier is formed by, for example, the MOSFET etc., and therefore, the linear amplifier can also be formed inside the semiconductor chip. In particular, the MOSFET is formed in the semiconductor chip including silicon as a principal component in order to form a control circuit etc., and therefore, part of the MOSFET can be used to produce the linear amplifier. As a result, the directional coupler and the linear amplifier can be formed inside the semiconductor chip, and therefore, the mounting substrate can be miniaturized without the need to increase the size of the mounting substrate.

Next, discussion is made on whether the characteristics of the LDMOSFET formed inside the semiconductor chip are adversely affected by the formation of the directional coupler inside the semiconductor chip. Since the directional coupler is constituted by the main line and the sub-line arranged in parallel to each other, whether or not the capacitance between the main line and the sub-line affects the LDMOSFET is considered. As a result of a calculation of capacitance on the assumption that the directional coupler includes two parallel plates, the capacitance per one directional coupler is about 0.01 (pF). Here, the output of the LDMOSFET is coupled to the matching circuit and the capacitor used in the matching circuit has a capacitance of tens of pF. From this, it can be thought that the influence of the formation of the directional coupler inside the semiconductor chip on the characteristics of the LDMOSFET is small because the capacitance of the directional coupler is sufficiently small compared to the capacitance of the capacitor used in the matching circuit.

Next, the method of manufacturing the semiconductor device in the present first embodiment is described with reference to the drawings.

Figure 10:
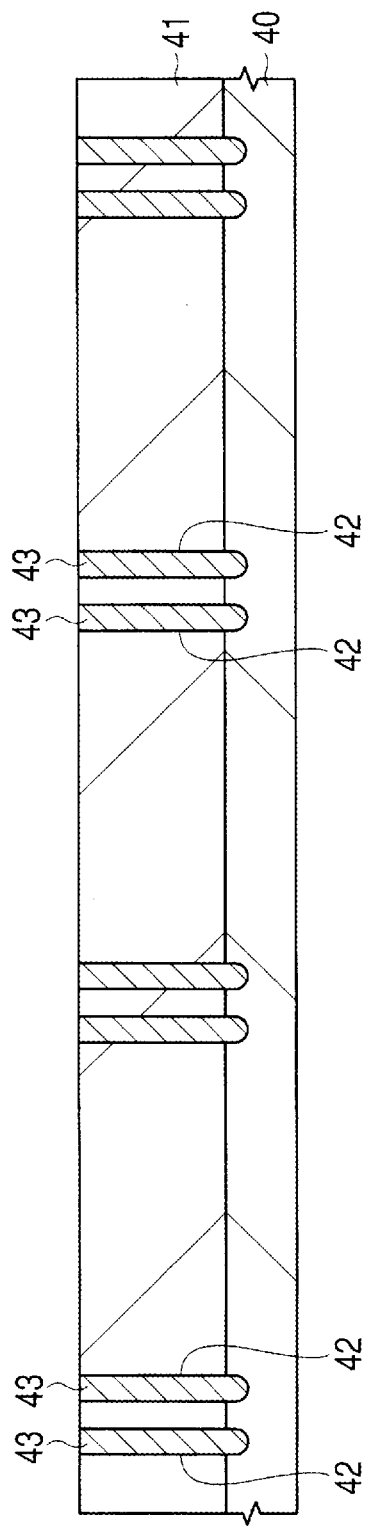
FIG. 10 is a cross-sectional view showing a manufacturing process of a semiconductor device in a first embodiment of the present invention.

First, as shown in FIG. 10, the p-type epitaxial layer 41 including p-type single crystal silicon is formed on the main surface of the semiconductor substrate 40 including p-type single crystal silicon using the epitaxial growth method.

Subsequently, a silicon oxide film is formed on the semiconductor substrate 40 and the silicon oxide film is etched using a photoresist film patterned by the lithography technique as a mask. Then, part of the p-type epitaxial layer 41 is etched using the rest of the silicon oxide film as a mask and thus a groove 42 that reaches the semiconductor substrate 40 is formed.

Then, after depositing a p-type polysilicon film into which p-type impurities (for example, boron (B)) have been introduced in a high concentration on the semiconductor substrate 40 including the inside of the groove 42 by the CVD (Chemical Vapor Deposition) method, the p-type punched layer 43 including a p-type polysilicon film is formed inside the groove 42 by removing the polysilicon film outside the groove 42 by the etch-back method. In this manner, the p-type punched layer 43 with a small parasitic resistance can be formed by embedding the p-type polysilicon film into which impurities have been introduced in a high concentration. Instead of a polysilicon film, a metal film (for example, a W (tungsten) film) may be embedded inside the groove 42, and in this case, a punched layer with a further smaller parasitic resistance can be formed.

Subsequently, a groove is formed by etching the epitaxial layer 41 using a silicon nitride film patterned by the photolithography technique as a mask and an element isolation region (not shown) 9 is formed by embedding a silicon oxide film in the groove. The formation of the element isolation region defines an active region on the main surface of the semiconductor substrate 40, in which the LDMOSFET cell is formed.

Figure 11:
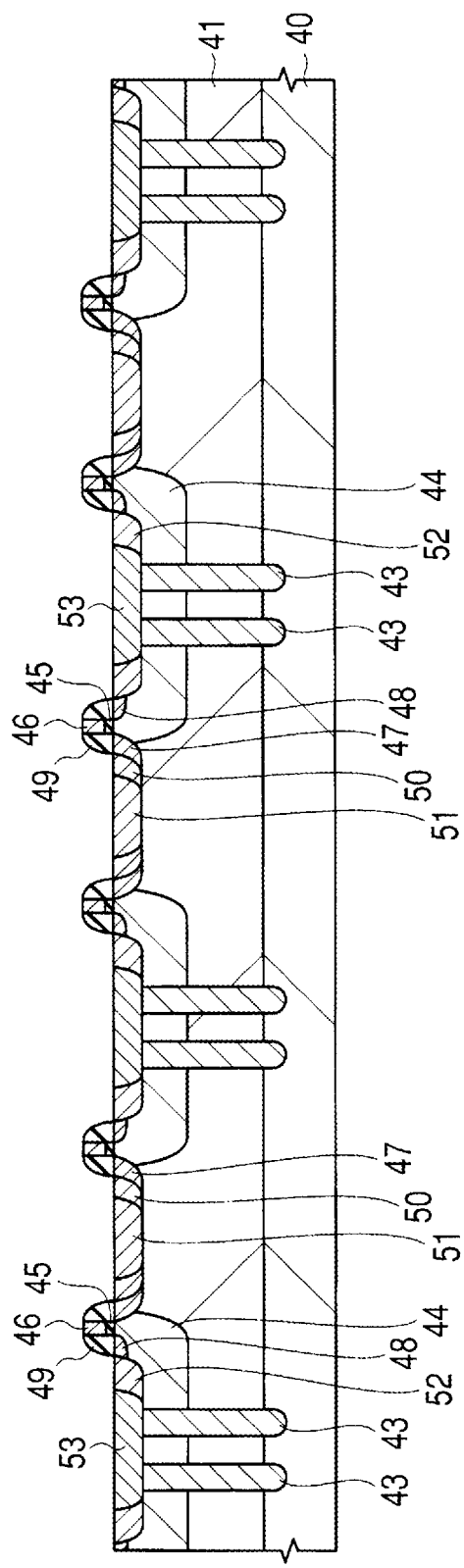
FIG. 11 is a cross-sectional view showing a manufacturing process of the semiconductor device following FIG. 10.

Next, as shown in FIG. 11, the p-type well 44 for punch through stopper is formed by implanting boron ions into part of the p-type epitaxial layer 41 using a photoresist film as a mask. The p-type well 44 is formed mainly in the source formation region and the channel formation region of the LDMOSFET.

Subsequently, after cleaning the surface of the p-type epitaxial layer 41 with a hydrofluoric acid, the gate insulating film 45 including a silicon oxide film is formed on the surface of the p-type epitaxial layer 41 by subjecting the semiconductor substrate 40 to thermal treatment. To the gate insulating film 45, instead of the silicon oxide film, a silicon oxide film including nitrogen, namely, a silicon oxide nitride film may be applied. In this case, the trap of hot electrons at the interface of the gate insulating film 45 can be reduced. In addition, it may also be possible to deposit a silicon oxide film by the CVD method on the top of the silicon oxide film formed by the thermal oxidizing method and configure the gate insulating film 45 with these two layers of silicon oxide film.

Next, the gate electrode 46 is formed on the top of the gate insulating film 45. In order to form the gate electrode 46, for example, a non-doped polysilicon film is deposited on the top of the gate insulating film 45 by the CVD method. Then, n-type impurities are introduced into the polysilicon film and after depositing a cap insulating film (not shown) including a silicon oxide film on the top of the polysilicon film by the CVD method, the cap insulating film and the polysilicon film are dry-etched using a photoresist film as a mask.

Subsequently, the n$^-$-type offset drain region (drain low concentration region) 47 is formed by implanting P (phosphorus) ions into part of the p-type epitaxial layer 41 using a photoresist film as a mask. The n$^-$-type offset drain region 47 is terminated at the lower part of the sidewall of the gate electrode 46 so that its end comes into contact with the channel formation region. By reducing the impurity concentration of the n$^-$-type offset drain region 47, the depletion layer between the gate electrode 46 and the drain region extends, and therefore, the feedback capacitance (Cgd) formed between them is reduced.

Next, after removing the photoresist film, the n$^-$-type source region 48 is formed by implanting As (arsenic) ions into the surface of the p-type well 44 using a new photoresist film as a mask. By forming a shallow n$^-$-type source region 48 by implanting impurity ions (As) at low acceleration energy, the spread of the impurities from the source region to the channel formation region can be suppressed, and therefore, the threshold voltage can be suppressed from dropping.

Subsequently, a p-type halo region (not shown) is formed at the lower part of the n$^-$-type source region 48 by implanting B (boron) ions into the surface of the p-type well 44 using a photoresist film as a mask. At this time, the operation of implanting impurity ions using the oblique ion implantation method in which impurity ions are implanted in the direction 30 degrees oblique to the main surface of the semiconductor substrate 40 and then rotating the semiconductor substrate 40 through 90 degrees is repeated four times. It is not necessarily required to form the p-type halo region, however, when this is formed, the diffusion of the impurities from the source region to the channel formation region is further suppressed and the short channel effect is further suppressed, and therefore, the drop of the threshold voltage can further be suppressed.

Next, after the photoresist film is removed, the sidewall 49 is formed on the sidewall of the gate electrode 46. The sidewall 49 is formed by depositing a silicon oxide film on the semiconductor substrate 40 by the CVD method and then subjecting the silicon oxide film to anisotropy etching. As the silicon oxide film for the sidewall 49, specifically, an HLD (High Temperature Low Pressure Decomposition) film formed by thermally decomposing a TEOS (tetraethylorthosilicate), an organic source, is used. The HLD film is excellent in the evenness of film thickness and characterized in that impurities are unlikely to diffuse in the film.

Subsequently, P (phosphorus) ions are implanted into part of the n$^-$-type offset drain region 47 using a photoresist film having an opening in the top of the drain formation region as a mask. Due to this, in the part of the n$^-$-type offset drain region 47, the n-type offset drain region (drain high concentration region) 50 is formed in a self-matching manner with respect to the sidewall 49 formed on the sidewall on the drain region side of the gate electrode 46.

The impurity concentration of the n-type offset drain region 50 becomes higher than the impurity concentration of the n$^-$-type offset drain region 47. In other words, the resistance of the n-type offset drain region 50 becomes less than that of the n$^-$-type offset drain region 47, and therefore, the on-resistance (Ron) can be reduced.

While the n$^-$-type offset drain region 47 is formed in a self-matching manner with respect to the gate electrode 46, the n-type offset drain region 50 is formed in a self-matching manner with respect to the sidewall 49 on the sidewall of the gate electrode 46, and therefore, the n-type offset drain region 50 is formed apart from the gate electrode 46 by an amount corresponding to the film thickness of the sidewall 49 along the lengthwise direction of the gate. As a result, even if the impurity concentration of the n-type offset drain region 50 is increased, the influence on the feedback capacitance (Cgd) is slight.

Next, after the photoresist film used to form the n-type offset drain region 50 is removed, As (arsenic) ions are implanted into part of the n-type offset drain region 50 and part of the p-type well 44, respectively, using a photoresist film having an opening in the top of part of the n-type offset drain region 50 and the p-type well 44 of the source formation region, respectively, as a mask.

Due to the ion implantation, in part of the n-type offset drain region 50, the n$^+$-type drain region (drain high concentration region) 51 is formed, the impurity concentration of which is higher than that of the n-type offset drain region 50 and which is more distant from the channel formation region than the n-type offset drain region 50.

In addition, due to the ion implantation described above, in the p-type well 44, the n$^+$-type source region 52 is formed, the impurity concentration of which is higher than that of the n$^-$-type source region 48 and the position of the bottom of which is deeper than that of the n$^-$-type source region 48. Since the n$^+$-type source region 52 is formed in a self-matching manner with respect to the sidewall 49 on the sidewall of the gate electrode 46, it is formed apart from the channel formation region by an amount corresponding to the film thickness of the sidewall 49 along the direction of the gate length.

As described above, by forming the n$^+$-type source region 52 in a self-matching manner with respect to the sidewall 49, it is possible to define with precision the distance between the n$^+$-type source region 52 and the channel formation region. On the other hand, if an attempt is made to form the n$^+$-type source region 52 distant from the channel formation region by implanting ions using a photoresist film as a mask without forming the sidewall 49 on the sidewall of the gate electrode 46, the distances between the n$^+$-type source region 52 and the channel formation region vary due to a misalignment of the mask. In this case, if the end of the n$^+$-type source region 52 comes too close to the channel formation region, the impurities in the n$^+$-type source region 52 diffuse in the channel formation region and the threshold voltages vary. On the other hand, if the end of the n$^+$-type source region 52 becomes too distant from the channel formation region, the source resistance increases.

As a result, according to the present first embodiment, in which the n$^+$-type source region 52 is formed in a self-matching manner with respect to the sidewall 49, even if the LDMOSFET is made finer, such a problem can be avoided, and therefore, miniaturization of LDMOSFET can be promoted.

By the processes so far, the LDMOSFET having the drain region including the n$^-$-type offset drain region 47, the n-type offset drain region 50, and the n$^+$-type drain region 51 and the source region including the n⁻-type source region 48 and the n⁺-type source region 52 is completed.

Since the LDMOSFET enables a high voltage drive with a short channel length, the n⁻-type offset drain region 47 is formed on one (drain region) side of the gate electrode 46 and the p-type well 44 is formed in the source formation region and the channel formation region on the other (source region) side. In addition, it is required to optimize the amount of charge in the n⁻-type offset drain region 47 and the distance between the end of the gate electrode 46 and the n⁺-type drain region 51 in a plane so that the breakdown voltage of the LDMOSFET is maximum.

Next, after the photoresist film used to form the n⁺-type drain region 51 and the n⁺-type source region 52 is removed, the p⁺-type semiconductor region 53 is formed by implanting boron fluoride ($BF_2$) ions into the surface of the p-type punched layer 43 using a photoresist film open in the top of the p-type punched layer 43 as a mask, and the resistance of the surface of the p-type punched layer 43 is reduced.

Figure 12:
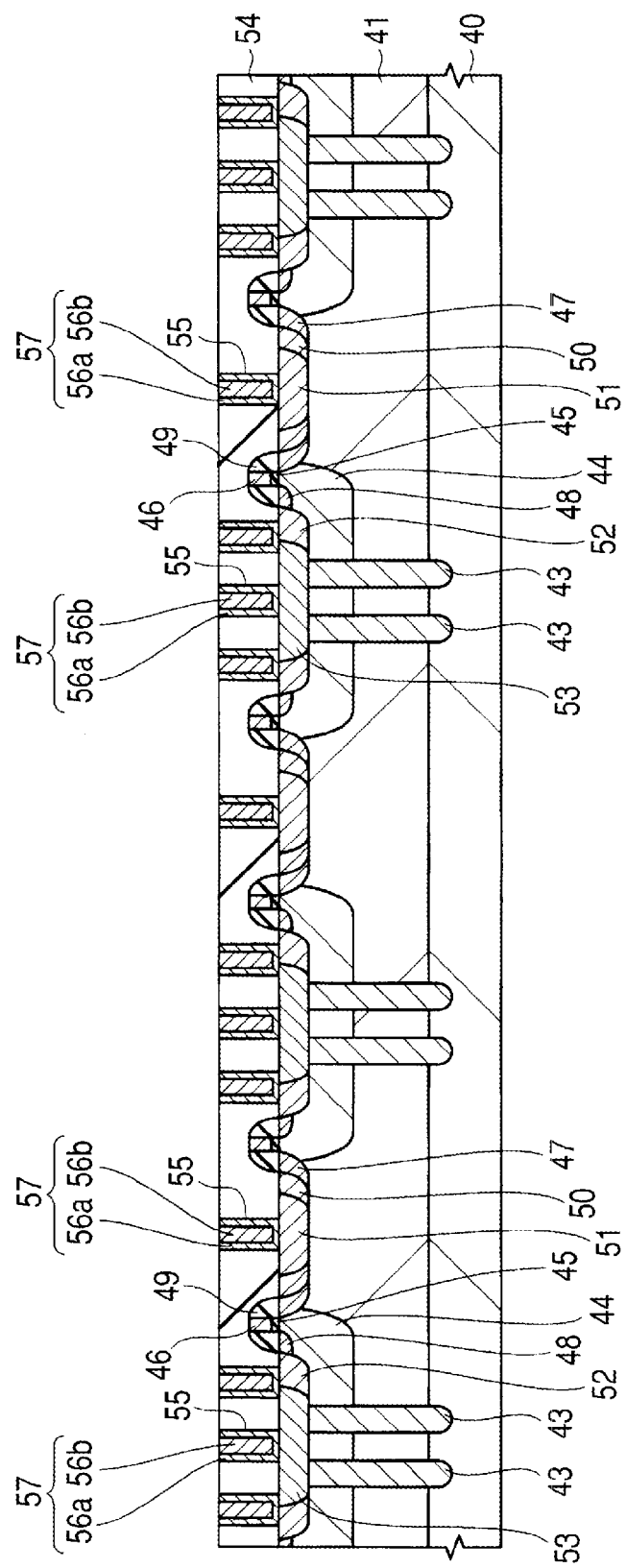
FIG. 12 is a cross-sectional view showing a manufacturing process of the semiconductor device following FIG. 11.

Then, after the photoresist film used to form the p⁺-type semiconductor region 53 is removed, as shown in FIG. 12, a silicon nitride film (not shown) and the silicon oxide film 54 are deposited on the semiconductor substrate 40 by the CVD method. After this, the surface of the silicon oxide film 54 is flattened using the CMP (Chemical Mechanical Polishing) method.

Subsequently, a contact hole 55 is formed in the top of the p-type punched layer 43 (the p⁺-type semiconductor region 53), the source region (the n⁺-type source region 52), the drain region (the n⁺-type drain region 51), and the gate electrode 46, respectively, by dry-etching the silicon oxide film 54 and the silicon nitride film using a photoresist film as a mask.

Next, a titan/titan nitride film 56a, which is a laminated film of a Ti (titan) film and a TiN (titan nitride) film, is deposited on the semiconductor substrate 40 including the inside of the contact hole 55 by the sputtering method. Then, a tungsten (W) film 56b is deposited on the semiconductor substrate 40 by the CVD method and the contact hole 55 is filled with the tungsten film. Subsequently, the titan/titan nitride film 56a and the tungsten film 56b on the semiconductor substrate 40 are removed by the CMP (Chemical Mechanical Polishing) method and by leaving the titan/titan nitride film 56a and the tungsten film 56b in the contact hole 55, the plug 57 including the titan/titan nitride film 56a and the tungsten film 56b in the contact hole 55 is formed.

Figure 13:
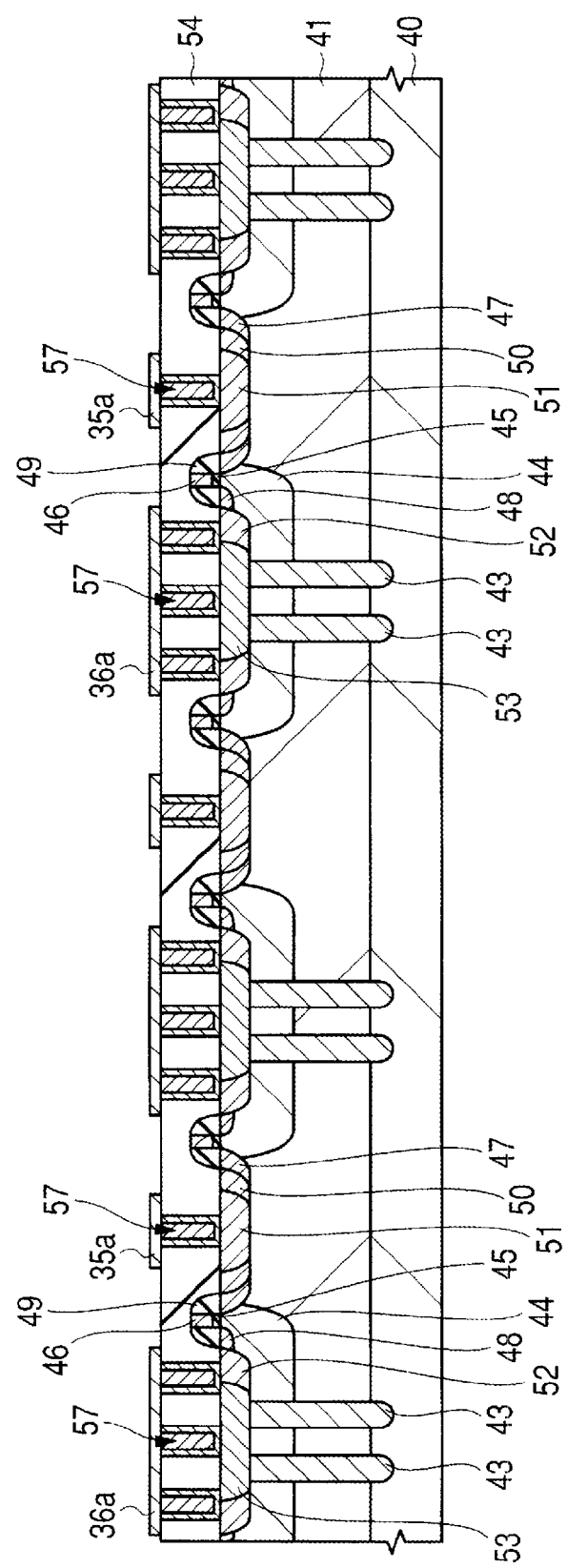
FIG. 13 is a cross-sectional view showing a manufacturing process of the semiconductor device following FIG. 12.

Subsequently, as shown in FIG. 13, a tungsten nitride (WN) film and a tungsten (W) film are deposited sequentially on the semiconductor substrate 40 by the sputtering method. Then, by etching the laminated film using a photoresist film as a mask, the source wire 36a that electrically couples the n⁺-type source region 52 and the p⁺-type semiconductor region 53, the drain wire 35a that electrically couples to the n⁺-type drain region 51, and the gate wire (not shown) that electrically couples to the gate electrode 46 are formed.

Figure 14:
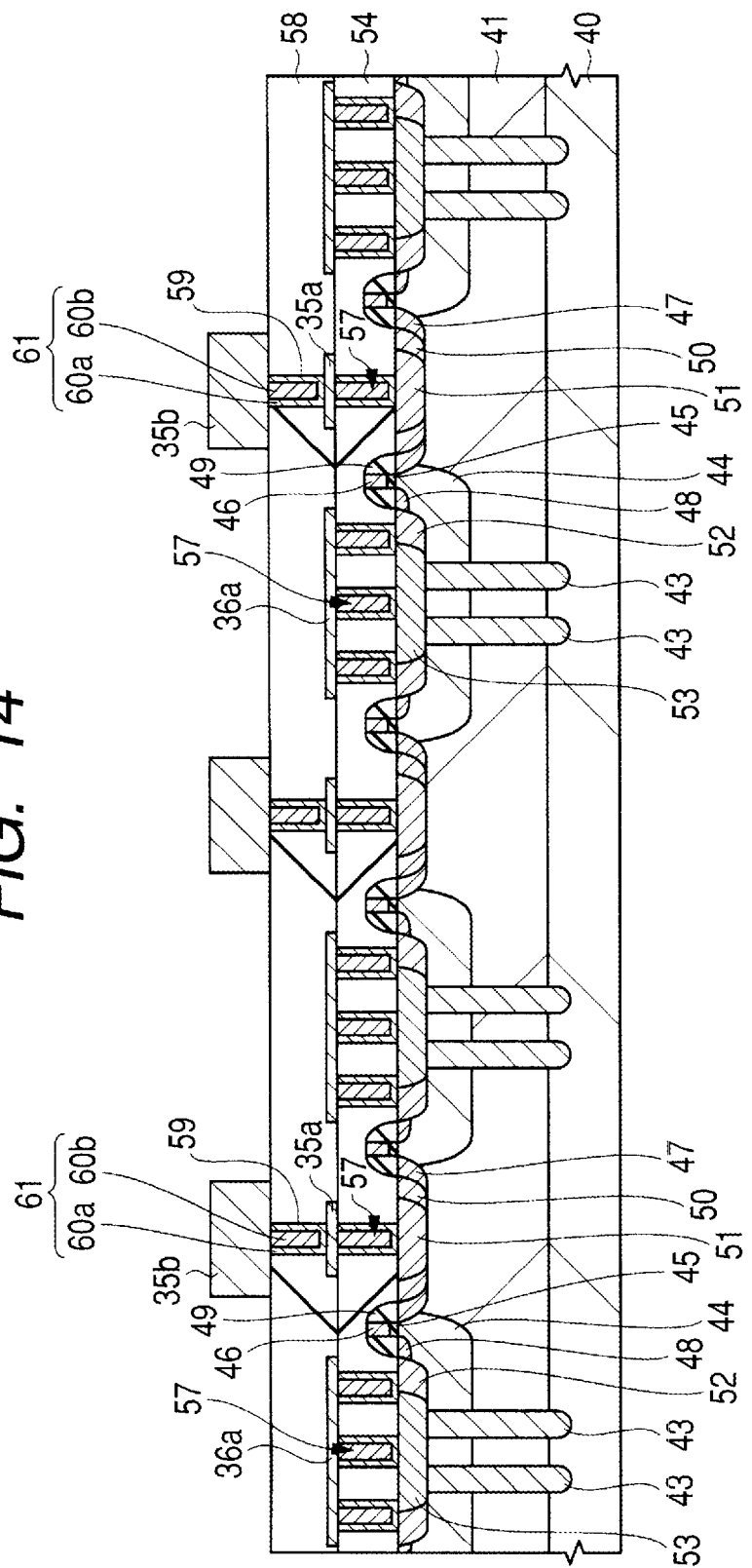
FIG. 14 is a cross-sectional view showing a manufacturing process of the semiconductor device following FIG. 13.

Next, as shown in FIG. 14, the silicon oxide film 58 is deposited on the top of the source wire 36a, the drain wire 35a, and the gate wire (not shown) by the CVD method, and then, by etching part of the silicon oxide film 58, a through hole 59 is formed, which reaches the drain wire 35a and the gate wire (not shown). Subsequently, by the same process as the process by which the plug 57 is formed, the plug 61 including a titan/titan nitride film 60a and a tungsten film 60b is formed in the through hole 59.

After this, a laminated film is formed on the silicon oxide film 58 including the plug 61 by sequentially laminating a titan film/titan nitride film, an aluminum film, and a titan/titan nitride film. Then, the laminated film is patterned by etching using a photoresist film as a mask and the drain wire 35b that electrically couples with the drain region (the n⁻-type offset drain region 47, the n-type offset drain region 50, and the n⁺-type drain region 51) of the LDMOSFET and the drain wire 35a and the second gate wire (not shown) that electrically couples with the gate electrode 46 and the gate wire (not shown) are formed.

Figure 15:
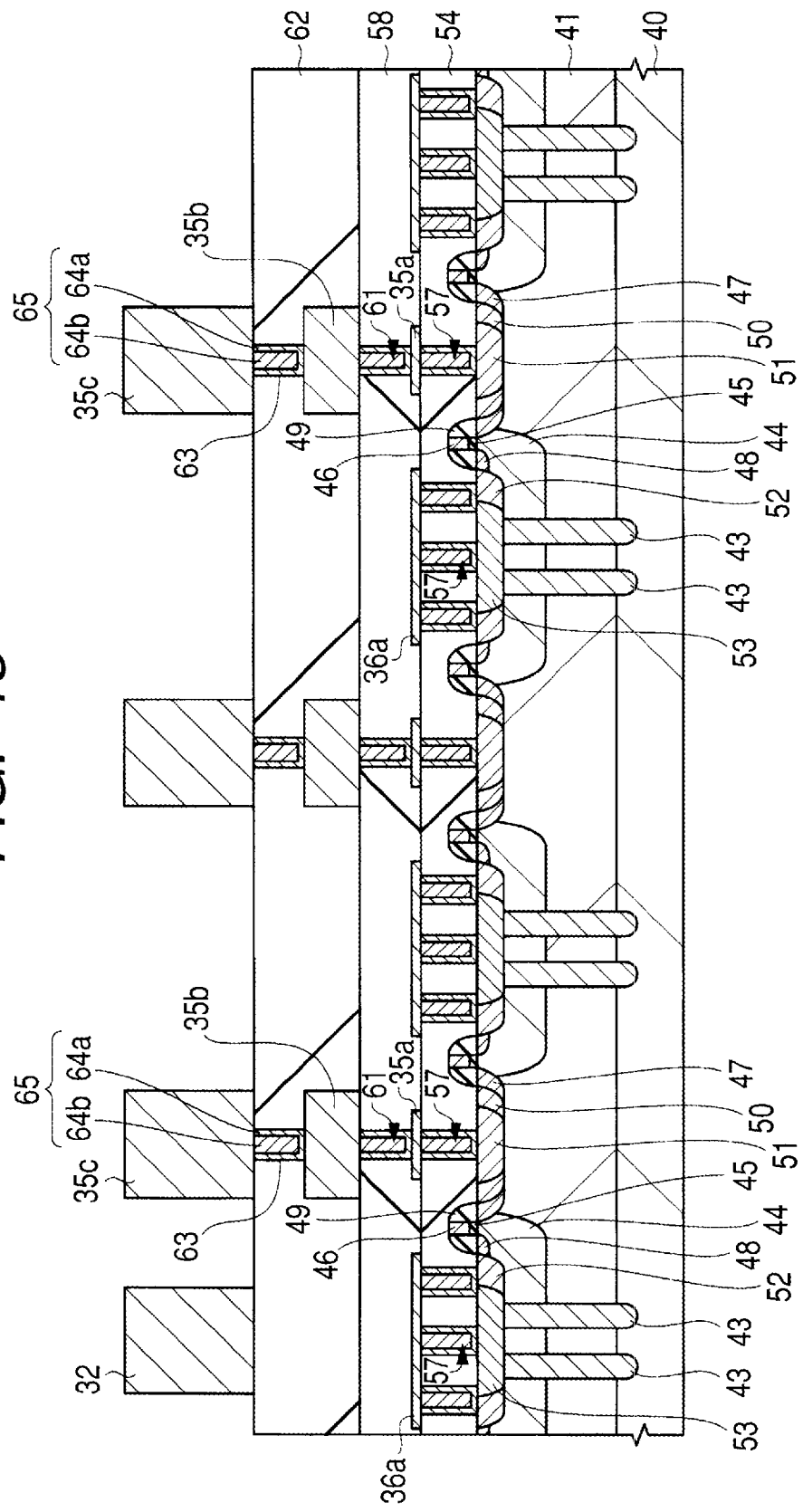
FIG. 15 is a cross-sectional view showing a manufacturing process of the semiconductor device following FIG. 14.

Next, as shown in FIG. 15, the silicon oxide film 62 is deposited on the silicon oxide film 58 including the drain wire 35b and the second gate wire (not shown) by the CVD method. Subsequently, a through hole 63 that reaches the drain wire 35b and the second gate wire (not shown) is formed by etching part of the silicon oxide film 62. The through hole 63 that reaches the second gate wire (not shown) is formed in the region not shown in FIG. 15. Then, by the same process as the process by which the plugs 57, 61 are formed, the plug 65 including a titan/titan nitride film 64a and a tungsten film 64b is formed in the through hole 63.

Next, a laminated film is formed on the silicon oxide film 62 including the plug 65 by sequentially laminating a titan film, an aluminum film, and a titan nitride film. Then, the laminated film is patterned by etching using a photoresist film as a mask and the drain wire 35c that electrically couples with the drain region (the n⁻-type offset drain region 47, the n-type offset drain region 50, and the n⁺-type drain region 51) of the LDMOSFET and the drain wires 35a, 35b and the third gate wire (not shown) that electrically couples with the gate electrode 46, the gate wire (not shown), and the second gate wire (not shown) are formed. Further, by this process, the sub-line 32 is formed in the region neighboring the predetermined drain wire 35c is formed. In other words, with the predetermined drain wire 35c as the main line, the directional coupler including the sub-line 32 neighboring the main line 32 is formed. In the present first embodiment, because no source wire is formed in the region neighboring the drain wire 35c, it is possible to form the sub-line 32 in the region neighboring the drain wire 35c and in which no source wire is formed. It is possible to form the sub-line 32 at the same time in the process in which the drain wire 35c is formed. In other words, it is possible to form the sub-line 32 only by changing the mask used to form the drain wire 35c. As described above, according to the present first embodiment, it is possible to form the directional coupler without making the processes complicated.

The wire that electrically couples with the gate electrode 46, the gate wire (not shown), and the second gate wire (not shown) is formed in the region not shown in FIG. 15. Part of the drain wire 35c will serve as a drain pad, to be described in the later processes, and part of the third gate wire (not shown) will serve as a gate pad, to be described in the later processes.

Next, as shown in FIG. 8, the silicon oxide film 66 and the silicon nitride film 67 are deposited on the silicon oxide film 62 including the drain wire 35c and the third gate wire (not shown) by the CVD method.

Subsequently, by etching the silicon nitride film 67 and the silicon oxide film 66 using a photoresist film as a mask, an opening that reaches the drain wire 35c and an opening in the third gate wire (not shown) are formed. Due to this, a drain pad (not shown) including part of the drain wire 35c and a gate pad (not shown) including part of the third gate wire (not shown) are formed.

Next, by polishing the backside of the semiconductor substrate 40, the backside electrode 68 is formed on the backside of the semiconductor substrate 40. The backside electrode 68 can be formed by, for example, depositing a Ni (nickel)-Cu (copper) alloy film by the sputtering method.

After this, the semiconductor substrate 40 is cut along the division area (not shown schematically) and divided into individual semiconductor chips and then they are soldered to the mounting substrate via the backside electrode 68. Due to this, the semiconductor device in the present first embodiment can be manufactured.

According to the present first embodiment, because the directional coupler can be formed inside the semiconductor chip, it is possible to miniaturize the RF power module. The above description is given using an example in which the drain wire has three layers as the multilayer wire structure of the drain wire. However, this is only an example, and the present invention can be applied to the case where the number of layers of the drain wire is three or more or less.

Second Embodiment

In the above first embodiment, an example is described, in which the sub-line 32 of the directional coupler is formed in the same layer as that of the drain wire 35c. However, in the present second embodiment, an example will be described, in which the sub-line 32 of the directional coupler is formed in the upper layer of the drain wire 35c.

Figure 16:
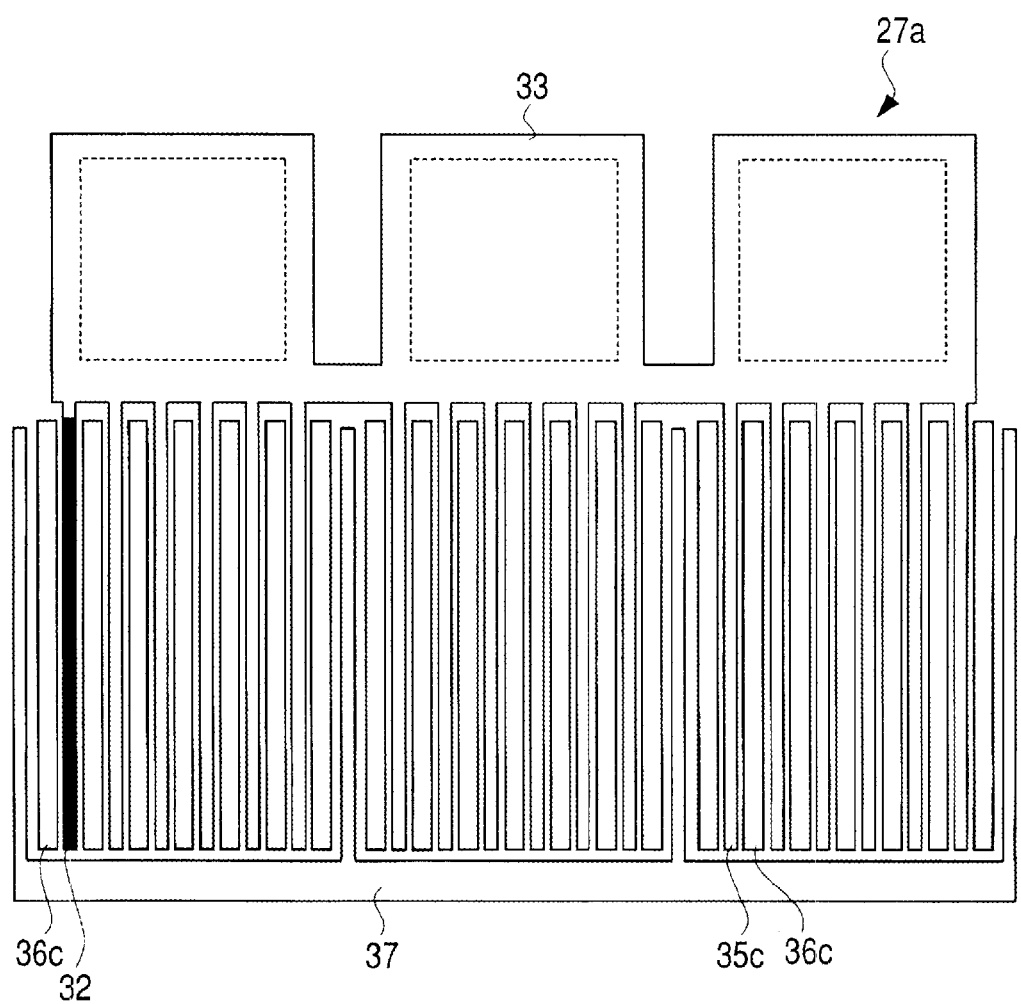
FIG. 16 is a top view showing a layout configuration of a final amplifier in a second embodiment.

FIG. 16 is a top view showing an example of the layout configuration of the final stage amplifier 27a formed in the semiconductor chip 11 shown in FIG. 6. The layout configuration of the final stage amplifier 27a shown in FIG. 16 is substantially the same as the layout configuration of the final stage amplifier 27a in the first embodiment shown in FIG. 7, and therefore, only a difference is described. The layout configuration of the final stage amplifier 27a shown in FIG. 16 differs from the layout configuration of the final stage amplification part 27a shown in FIG. 7 in the position of arrangement of the sub-line 32 constituting the directional coupler. In other words, while the sub-line 32 of the directional coupler is formed in the same layer as that of the drain wire 35c in the above first embodiment (refer to FIG. 7 and FIG. 8), in the present second embodiment, the sub-line 32 of the directional coupler is formed in the upper layer of the drain wire 35c.

Figure 17:
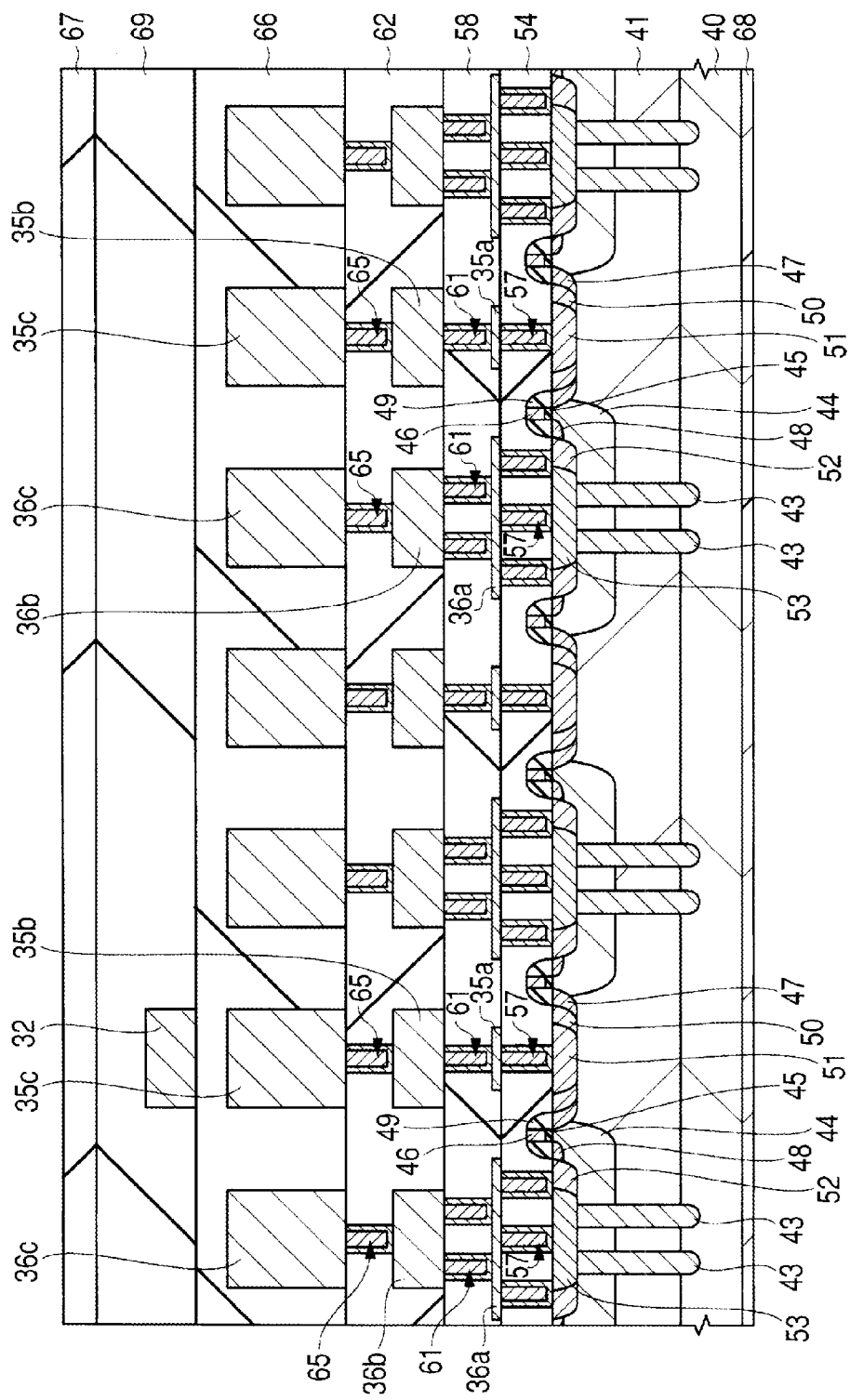
FIG. 17 is a cross-sectional view showing a partial section of a final amplifier including a directional coupler.

FIG. 17 is a cross-sectional view showing a partial section of the final stage amplifier 27a including the directional coupler. As shown in FIG. 17, in the present second embodiment, the drain wire has the three-layer wire structure with the drain wires 35a, 35b, 35c, and further, the source wire has the three-layer wire structure with the source wires 36a, 36b, 36c. In this case, unlike the above first embodiment, the source wire 36c is formed in the same layer as that of the drain wire 35c, the sub-line 32 of the directional coupler cannot be formed in the region neighboring the drain wire 35c. Because of this, in the present second embodiment, the sub-line 32 is formed in the upper layer of the drain wire 35c. Also in such a case where the sub-line 32 is provided in the upper layer of the drain wire 35c, the directional coupler is formed by the main line including the drain wire 35c and the sub-line formed on the main line via the silicon oxide film 66, which is an insulating film. In other words, the directional coupler detects the power that propagates through the main line by the electromagnetic coupling between the main line and the sub-line 32, and electromagnetic coupling occurs when the sub-line 32 is present around the main line, and therefore, the directional coupler can be configured similarly also in the case where the sub-line is formed in the same layer as that of the main line and in the case where the sub-line is formed in the upper layer of the main line.

Figure 18:
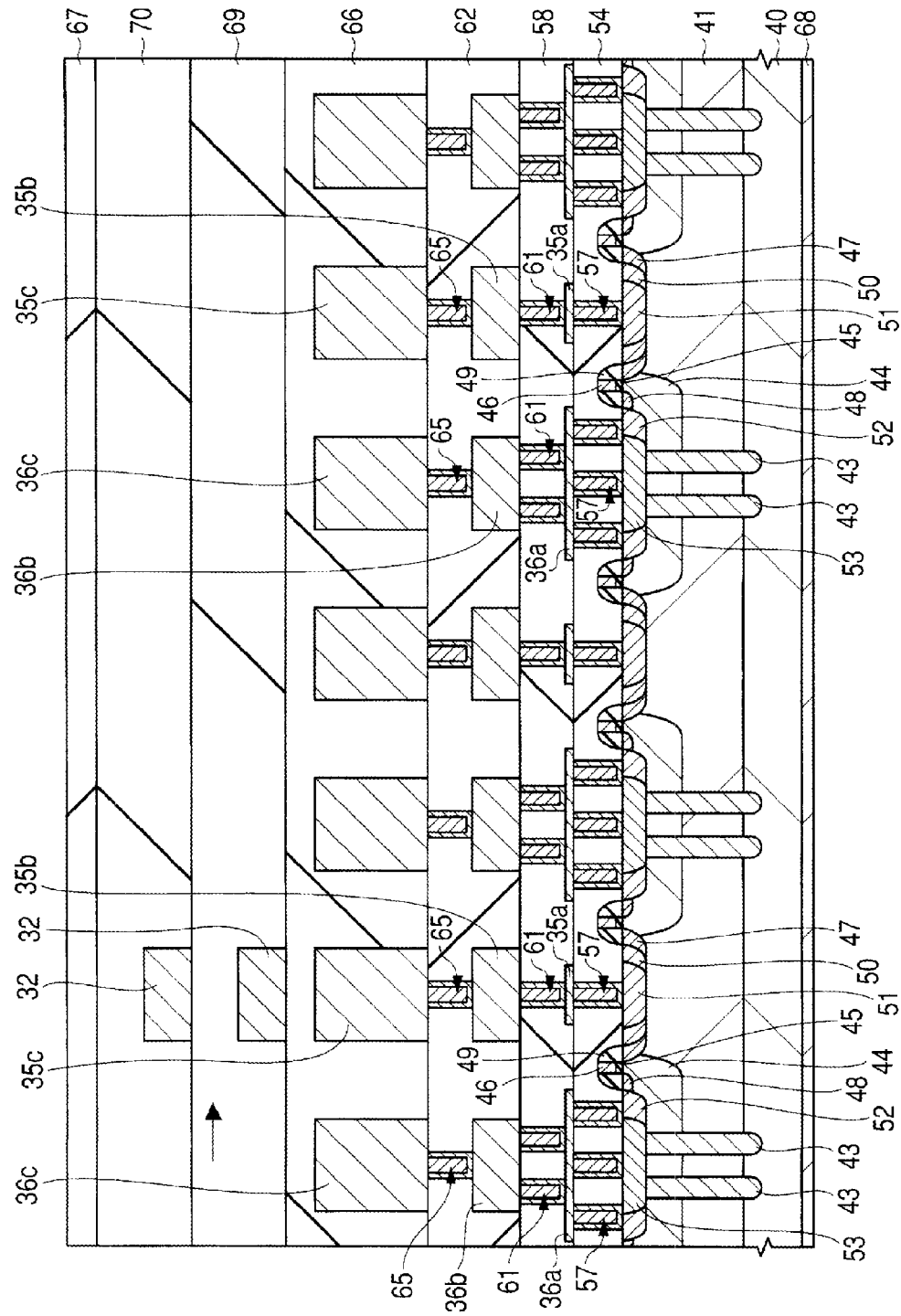
FIG. 18 is a cross-sectional view showing a partial section of the final amplifier including the directional coupler.
Figure 19:
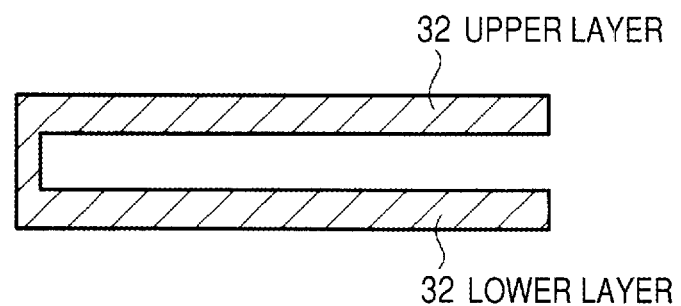
FIG. 19 is a diagram showing a connection relationship between a sub-line formed in a lower layer and a sub-line formed in an upper layer.
Figure 20:
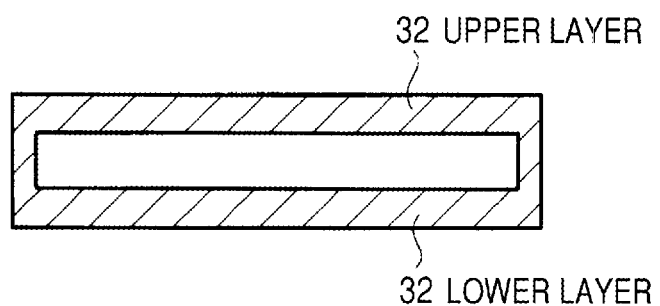
FIG. 20 is a diagram showing a connection relationship between the sub-line formed in a lower layer and the sub-line formed in an upper layer.

In FIG. 17, the sub-line 32 is provided in the upper layer of the drain wire 35c and the sub-line 32 is formed by one layer, however, the sub-line 32 formed in the upper layer of the drain wire 35c may have a multilayer structure, as shown in FIG. 18. In this case, a silicon oxide film 69 is formed on the sub-line 32 in the lower layer and the sub-line 32 in the upper layer is formed on the silicon oxide film 69. Further, a silicon oxide film 70 that covers the sub-line 32 in the upper layer is newly formed. In the case shown in FIG. 18, the sub-line 32 formed in the lower layer and the sub-line 32 formed in the upper layer are coupled, for example, as shown in FIG. 19 or FIG. 20. FIG. 19 and FIG. 20 show the sub-line 32 when viewed in the direction of the arrow in FIG. 18. By letting the sub-line 32 have a multilayer structure as described above, the length of the sub-line 32 can be increased and the degree of coupling of the electromagnetic coupling with the main line (drain wire 35c) can be increased.

In the present second embodiment, an example is described, in which the sub-line 32 is formed in the upper layer of the drain wire 35c on the assumption that both the drain wire and the source wire have a three-layer structure. However, the sub-line 32 may be provided in the upper layer of the drain wire 35c even when the number of wire layers of the source wire is smaller than the number of wire layers of the drain wire, as with the above first embodiment.

Third Embodiment

In the above second embodiment, an example is described, in which the directional coupler is configured by using one drain wire 35c as the main line and providing the sub-line 32 in the upper layer of the main line. However, in the present third embodiment, an example is described, in which a plurality of the drain wires 35c is used as the main line and the sub-line 32 is provided on the drain wires 35c.

Figure 21:
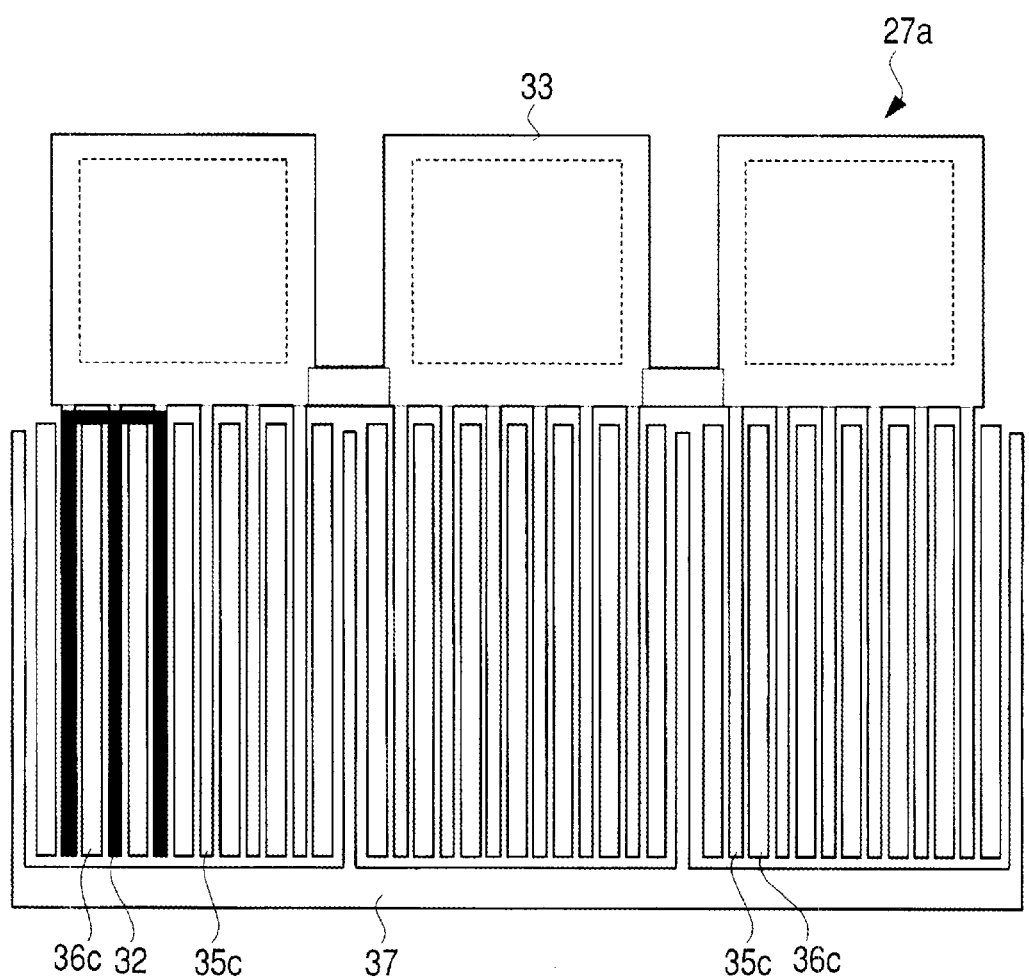
FIG. 21 is a top view showing a layout configuration of a final amplifier in a third embodiment.
Figure 22:
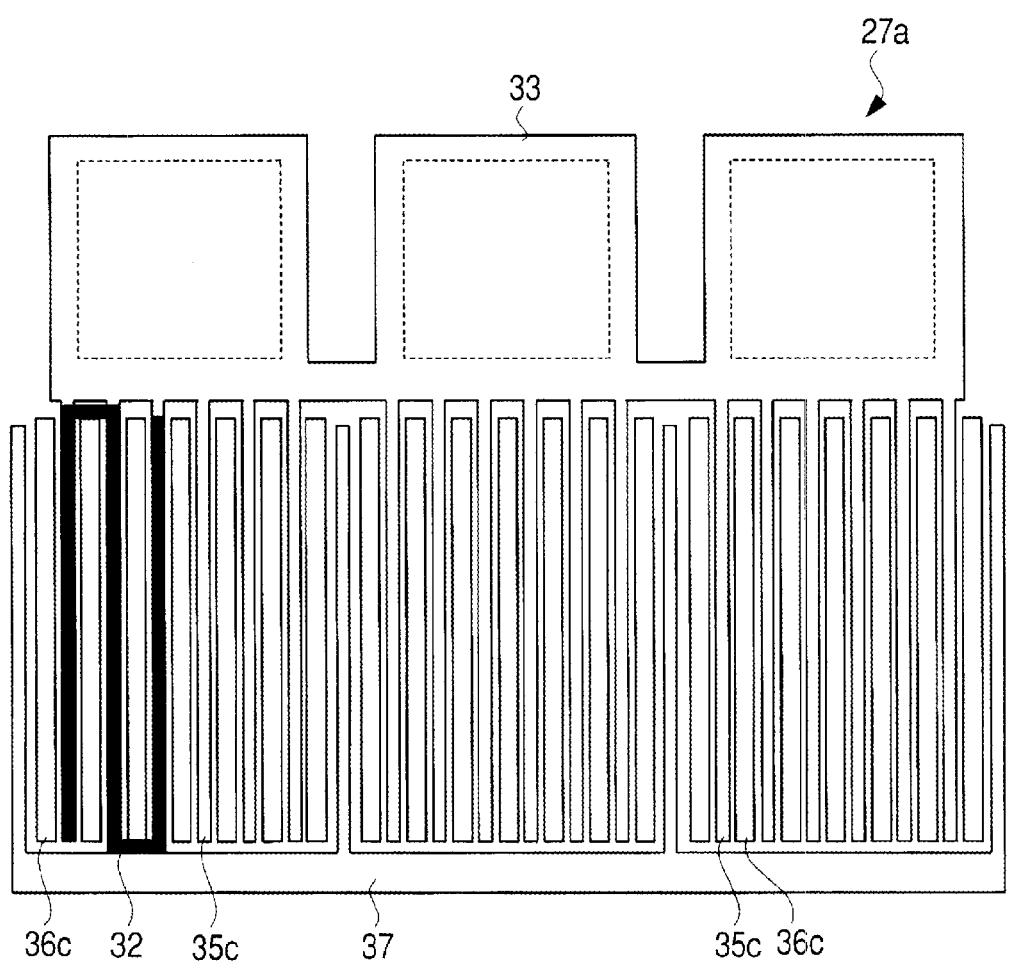
FIG. 22 is a top view showing a layout configuration of the final amplifier in the third embodiment.

FIG. 21 is a top view showing an example of a layout configuration of the final stage amplifier 27a formed in the semiconductor chip 11 shown in FIG. 6. The layout configuration of the final stage amplifier 27a shown in FIG. 21 is substantially the same as the layout configuration of the final stage amplifier 27a in the above first embodiment shown in FIG. 7, and therefore, a difference is described. The layout configuration of the final stage described 27a shown in FIG. 21 differs from the layout configuration of the final stage described 27a shown in FIG. 7 in that the directional coupler is configured by forming the sub-line 32 on the drain wires 35c. In FIG. 21, for example, the sub-line 32 is formed over the three neighboring drain wires 35c. The respective sub-lines 32 formed over the three neighboring drain wires 35c are coupled on one common end. The method of coupling the sub-lines 32 formed over the drain wires 35c is not limited to that shown in FIG. 21, and the three sub-lines 32 may be coupled in an S-shaped manner as shown in FIG. 22.

Figure 23:
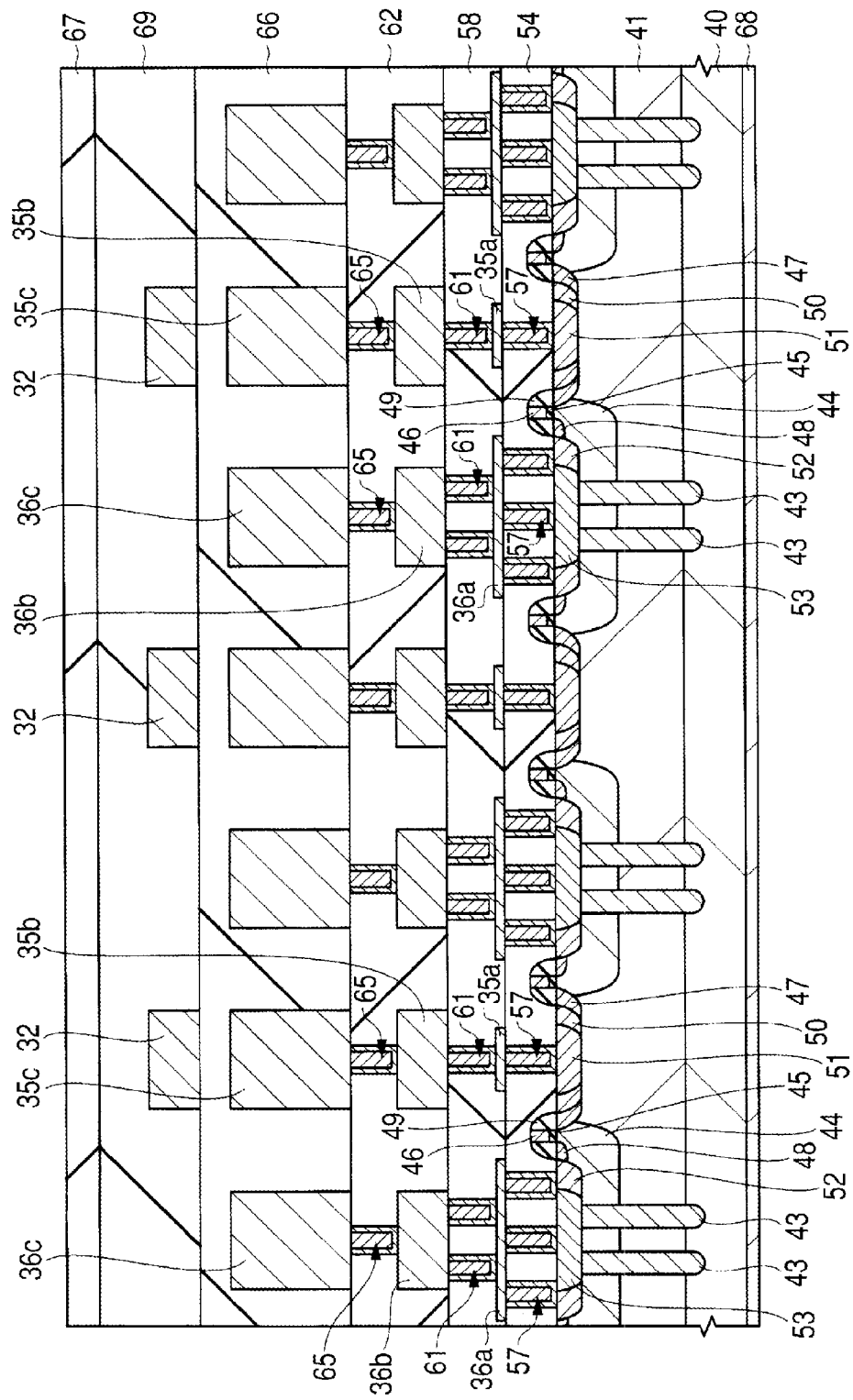
FIG. 23 is a cross-sectional view showing a partial section of a final amplifier including a directional coupler.

FIG. 23 is a cross-sectional view showing a partial section of the final stage amplifier 27a including the directional coupler. As can be seen from FIG. 23, in the present third embodiment, the neighboring drain wires 35c serve as the main line of the directional coupler and over the drain wires 35c, the sub-lines 32 are formed. The sub-lines 32 formed over the drain wires 35c are coupled with one another, forming one directional coupler.

According to the third embodiment, the drain wires 35c are used as the main line and the sub-lines 32 are formed over the main line, and therefore, the main line and the sub-line constituting the directional coupler can be increased in length. As a result, an effect that the degree of coupling of the directional coupler can be increased is obtained. In the present third embodiment, an example is explained, in which the three drain wires 35c are used as the main line, however, the number of drain wires 35c used as the main line may be more than three or less than three.

Fourth Embodiment

Figure 24:
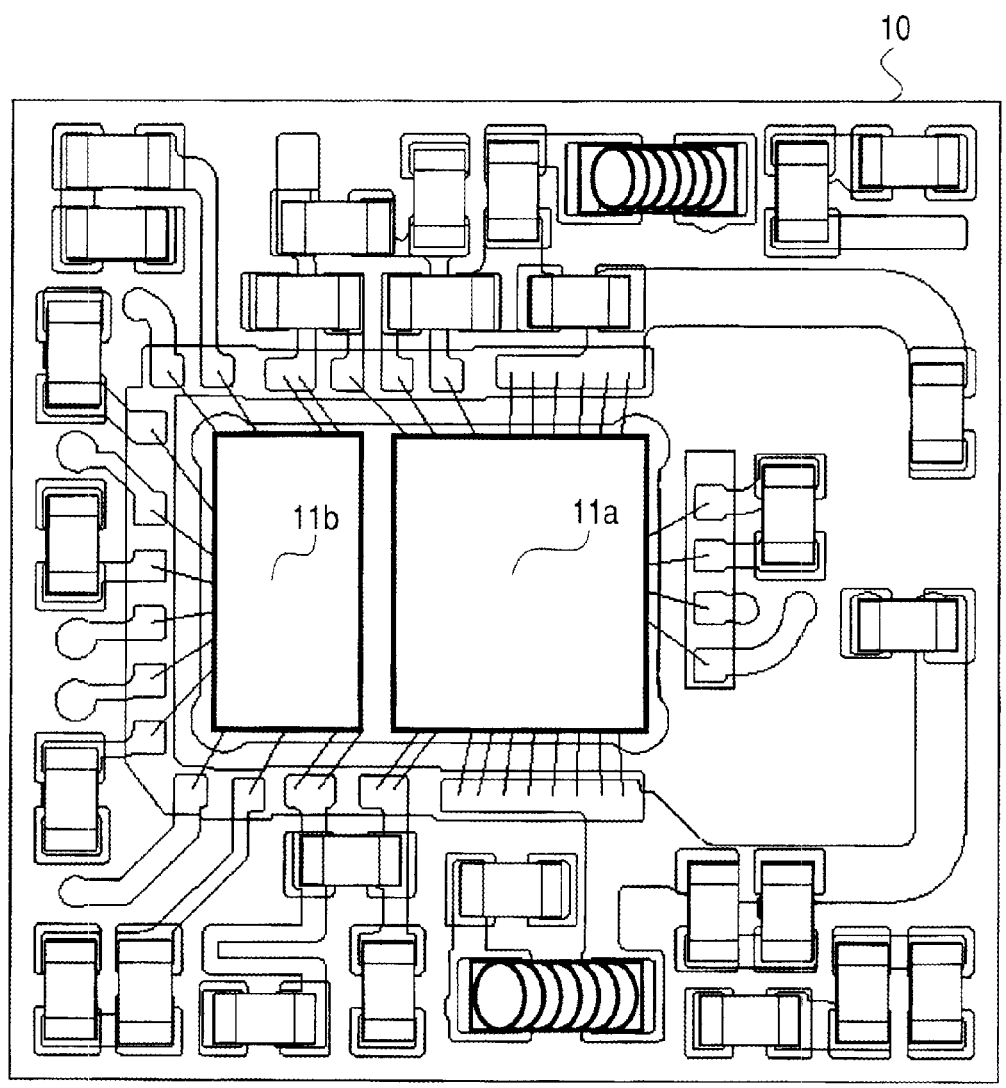
FIG. 24 is a top view showing a mounting configuration of an RF power module in a fourth embodiment.

In the above first embodiment, as shown in FIG. 5, an example is described, in which one semiconductor chip 11 is mounted on the mounting substrate 10 constituting the RF power module, however, in the present fourth embodiment, another embodiment is described. In other words, in the above first embodiment, the amplifier circuits 13a, 13b, the band-switching switches 18, 19, and the differential amplifier 20 shown in FIG. 2 are formed in one semiconductor chip 11. However, in the present fourth embodiment, for example, the amplifier circuits 13a, 13b, the band-switching switches 18, 19, and the differential amplifier 20 shown in FIG. 2 are formed separately in two semiconductor chips 11a, 11b on the mounting substrate 10 as shown in FIG. 24. For example, in FIG. 24, the amplifier circuits 14a, 14b shown in FIG. 2 are formed in the semiconductor chip 11a and the control circuits that control the amplifier parts 14a, 14b, such as the bias circuits 15a, 15b, shown in FIG. 2 are formed in the semiconductor chip 11b. In the case where such a configuration is employed, it is desirable that the directional couplers 16a, 16b shown in FIG. 2 be formed in the semiconductor chip 11a. This is because, in the semiconductor chip 11a, the amplifier parts 14a, 14b that amplify power are formed and the directional couplers 16a, 16b have the function of detecting the power amplified in the amplifier parts 14a, 14b. In other words, when the directional couplers 16a, 16b are formed in the semiconductor chip 11b, it is necessary to draw the output from the amplifier parts 14a, 14b formed in the semiconductor chip 11a to the semiconductor chip 11b and this will make the configuration complicated. The detector circuits 17a, 17b shown in FIG. 2 may be formed in either of the semiconductor chips 11a, 11b. When the amplifier parts 14a, 14b and the control circuits (the bias circuits 15a, 15b etc.) are formed separately in the semiconductor chips 11a, 11b, it is also possible to achieve the miniaturization of the mounting substrate 10 by forming the directional couplers 16a, 16b inside the semiconductor chip 11a.

Figure 25:
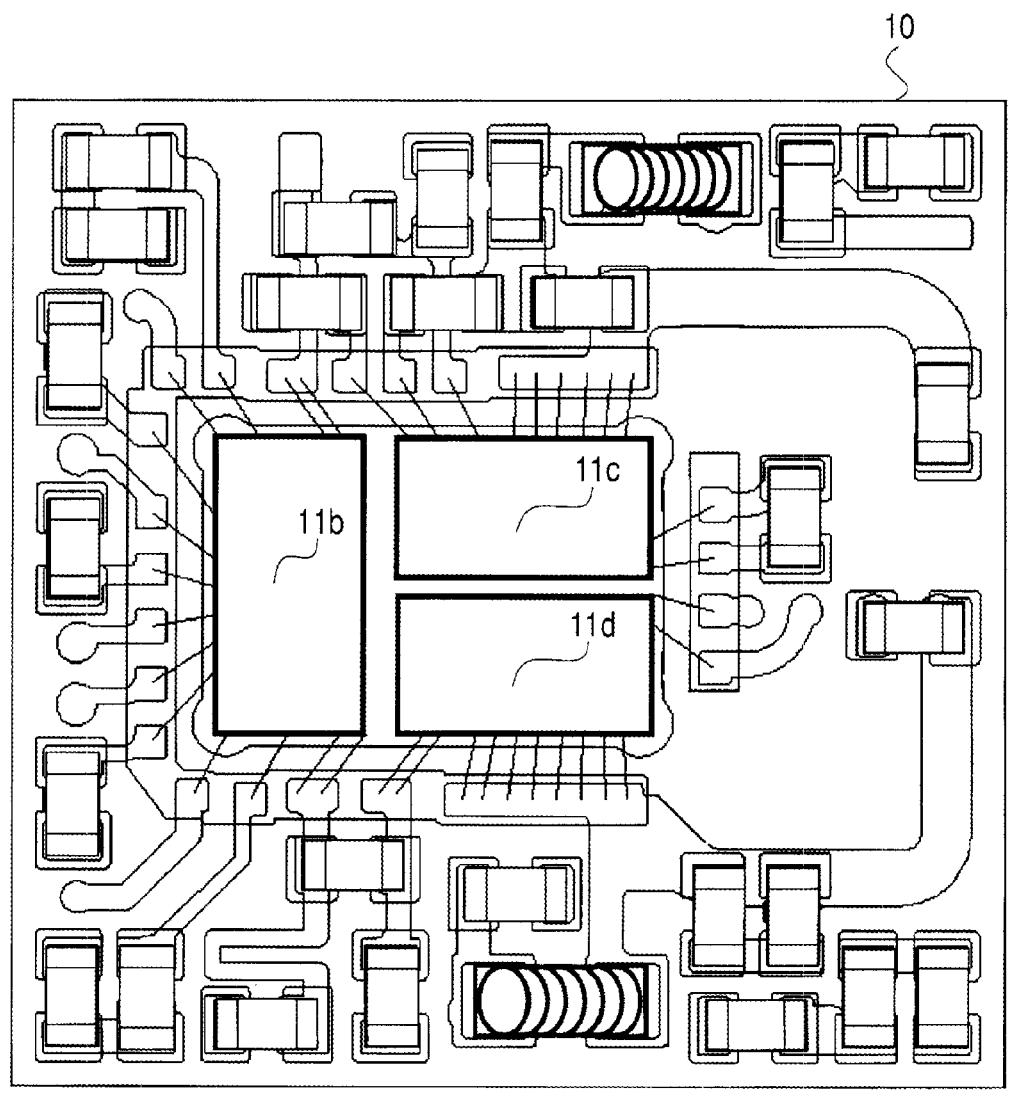
FIG. 25 is a top view showing a mounting configuration of the RF power module.

FIG. 25 is a top view showing an example in which three semiconductor chips 11b, 11c, 11d are formed on the mounting substrate 10. In this case, in the semiconductor chip 11b, the control circuits, such as the bias circuits 15a, 15b etc., shown in FIG. 2 are formed. On the other hand, in the semiconductor chip 11c, the amplifier part 14a and the directional coupler 16a shown in FIG. 2 are formed. In addition, in the semiconductor chip 11d, the amplifier part 14b and the directional coupler 16b shown in FIG. 2 are formed. In other words, in the semiconductor chip 11c, the amplifier part 14a for the GSM system low frequency band is formed and in the semiconductor chip 11d, the amplifier part 14b for the GSM system high frequency band is formed. The detector circuit 17a shown in FIG. 2 is formed in the semiconductor chip 11b or the semiconductor chip 11c and the detector circuit 17b is formed in the semiconductor chip 11b or the semiconductor chip 11d. Even when the three semiconductor chips 11b, 11c, 11d are mounted on the mounting substrate as described above, it is possible to achieve the miniaturization of the mounting substrate 10 by forming the directional coupler 16a in the semiconductor chip 11c in which the amplifier part 14a is formed and forming the directional coupler 16b in the semiconductor chip 11d in which the amplifier part 14b is formed.

Figure 26:
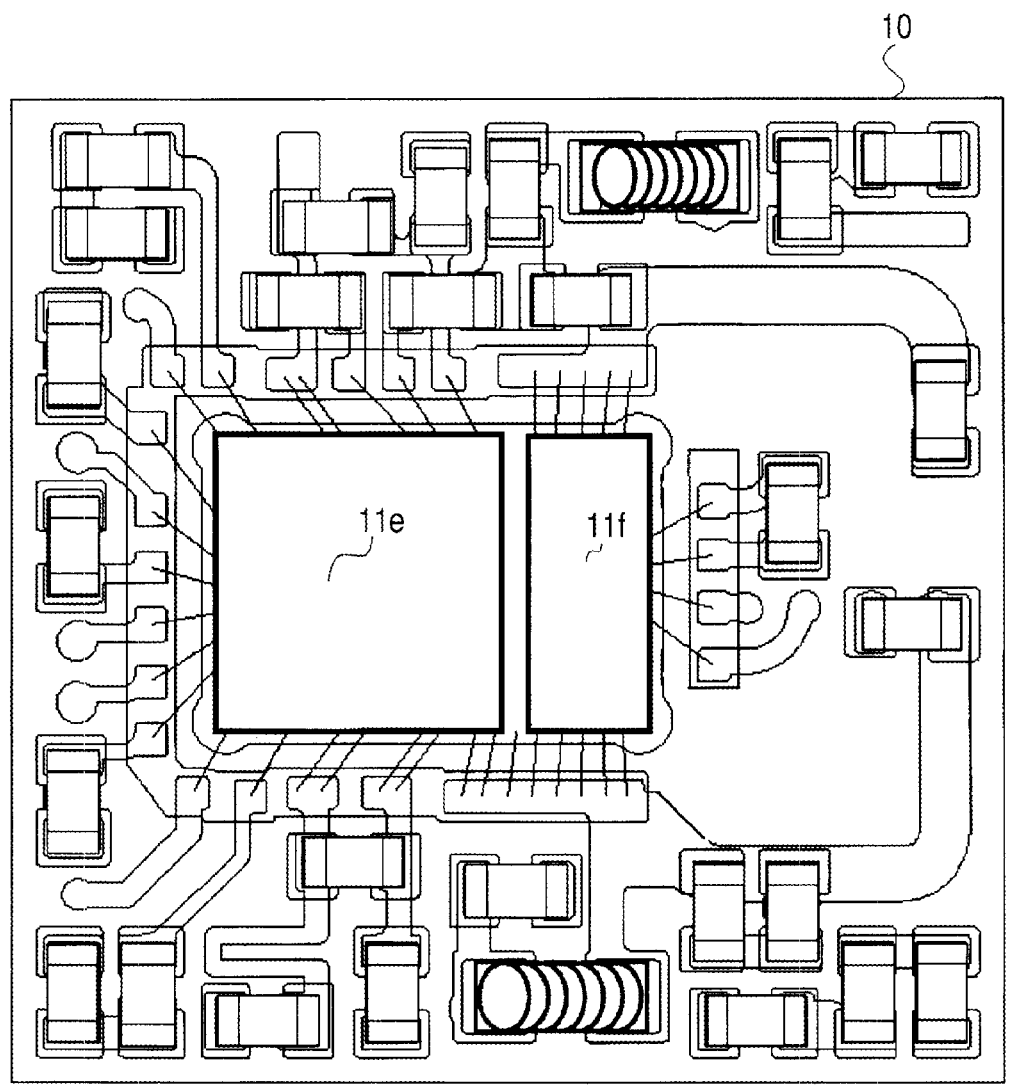
FIG. 26 is a top view showing a mounting configuration of the RF power module.

FIG. 26 is a top view showing an example in which two semiconductor chips 11e, 11f are mounted on the mounting substrate 10. In this case, in the semiconductor chip 11e, the amplifier parts 14a, 14b, the bias circuits 15a, 15b (control circuits), the directional couplers 16a, 16b, etc., shown in FIG. 2 are formed. On the other hand, in the semiconductor chip 11f, the detector circuits 17a, 17b shown in FIG. 2 are formed. In other words, in FIG. 26, only the detector circuits 17a, 17b are formed separately in the semiconductor chip 11f. Even when the two semiconductor chips 11e, 11f are mounted on the mounting substrate 10 as described above, it is possible to achieve the miniaturization of the mounting substrate 10 by forming the directional couplers 16a, 16b in the semiconductor chip 11e in which the amplifier parts 14a, 14b are formed.

Figure 27:
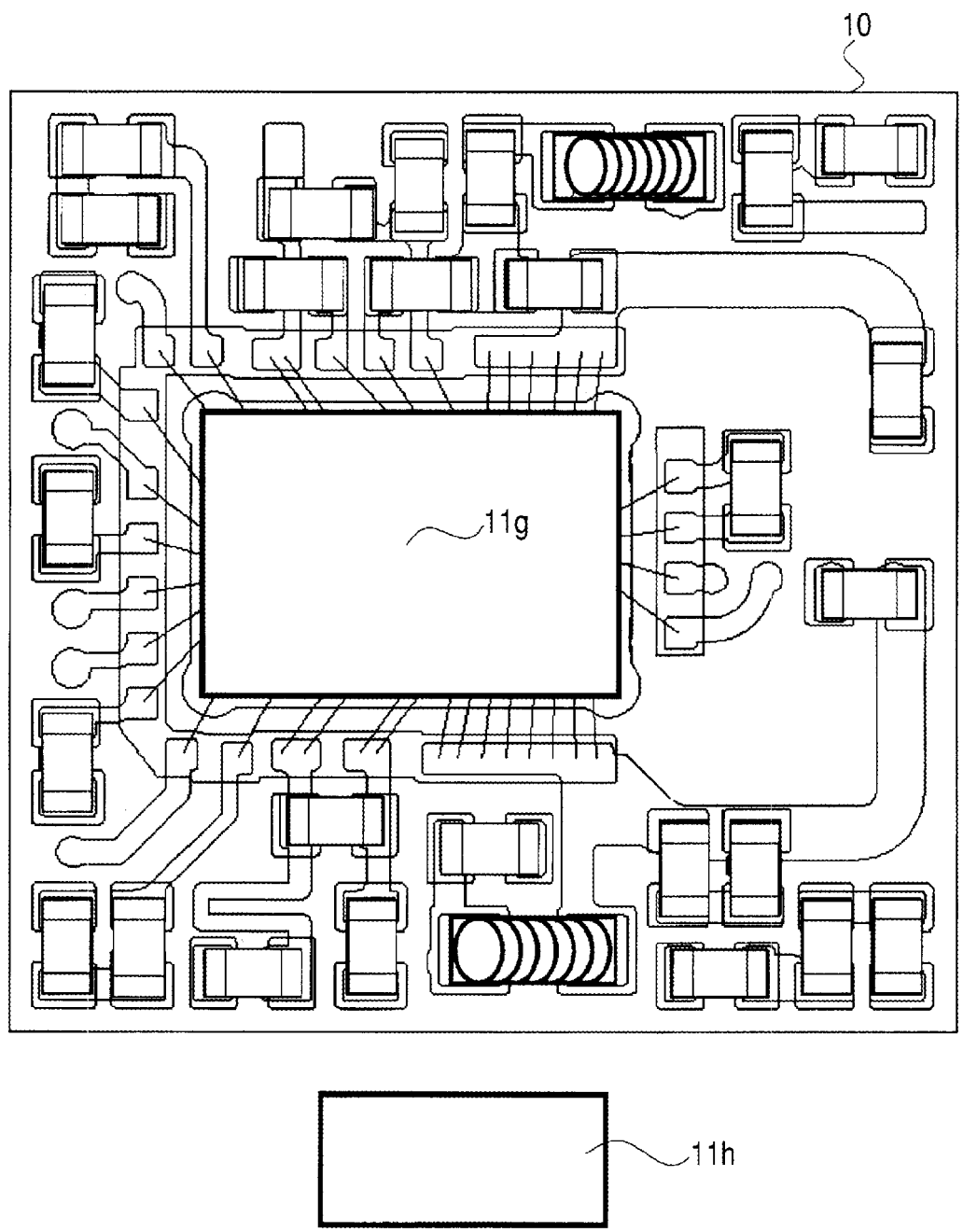
FIG. 27 is a top view showing a mounting configuration of the RF power module.

FIG. 27 is a top view showing an example in which a semiconductor chip 11g is mounted on the mounting substrate 10 and a semiconductor chip 11h is arranged outside the mounting substrate 10. In this case, in the semiconductor chip 11h, the detector circuits 17a, 17b shown in FIG. 2 are formed and other circuits are formed in the semiconductor chip 11g. In other words, in the semiconductor chip 11g, the amplifier parts 14a, 14b, the bias circuits 15a, 15b (control circuits), the directional couplers 16a, 16b, etc., are formed. Even when the detector circuits 17a, 17b are formed in the semiconductor chip 11h arranged outside the mounting substrate 10, it is possible to achieve the miniaturization of the mounting substrate 10 by forming the directional couplers 16a, 16b in the semiconductor chip 11g in which the amplifier parts 14a, 14b are formed.

As described above, even when the circuits shown in FIG. 2 are realized by various layout configurations, it is possible to achieve the miniaturization of the mounting substrate 10 constituting the RF power module by forming the directional couplers 16a, 16b inside the semiconductor chip.

Fifth Embodiment

In the present fifth embodiment, an example is described, in which the RF power module is formed with the layout configuration in FIG. 24 described in the above fourth embodiment. In FIG. 24, the semiconductor chip 11a and the semiconductor chip 11b are mounted on the mounting substrate 10 and in the semiconductor chip 11a, the amplifier parts 14a, 14b and the directional couplers 16a, 16b shown in FIG. 2 are formed and in the semiconductor chip 11b, the control circuits, such as the bias circuits 15a, 15b etc., shown in FIG. 2 are formed. In particular, in the present fifth embodiment, an example is described, in which the detector circuits 17a, 17b shown in FIG. 2 are also mounted in the semiconductor chip 11b. In the present fifth embodiment, the semiconductor chip 11a includes a compound semiconductor substrate (semi-insulating substrate), such as a GaAs substrate etc., and the semiconductor chip 11b includes a silicon substrate.

For example, there is a semiconductor element that uses a III-V group compound semiconductor, such as gallium arsenide (GaAs). A compound semiconductor has a characteristic that the mobility is higher compared to silicon (Si) and semi-insulating crystal can be obtained therefrom. In addition, it is possible to create mixed crystal of a compound semiconductor and form a heterojunction.

Among semiconductor elements that use a heterojunction is a heterojunction-type bipolar transistor (hereinafter, referred to as an HBT (Heterojunction Bipolar Transistor)). The HBT is a bipolar transistor that uses gallium arsenide for the base layer and indium gallium phosphide (InGaP), aluminum gallium arsenide (AlGaAs), etc., for the emitter layer. In other words, the HBT is a bipolar transistor that forms a heterojunction by using different semiconductor materials for the base layer and the emitter layer.

Due to the heterojunction, it is possible to make the forbidden bandwidth of the emitter greater than that of the base at the base emitter junction. As a result, the HBT has a characteristic that the current amplification factor is considerably high because the amount of carrier implanted from emitter to base can be increased considerably compared to the amount of carrier of opposite charge implanted from base to emitter.

The HBT has a considerably high current amplification factor as described above, and therefore, is used, for example, in a power amplifier (RF (Radio Frequency) module) mounted on a mobile phone. In an RF module, a semiconductor chip in which the HBT is formed is mounted on the mounting substrate. Because of this, in the present fifth embodiment, the amplifier parts 14a, 14b formed in the semiconductor chip 11a shown in FIG. 24 are formed by the HBT. On the other hand, the bias circuits 15a, 15b and the detector circuits 17a, 17b shown in FIG. 2 are formed using a normal MOSFET (Field Effect Transistor), and therefore, they are formed in the semiconductor chip 11b including a silicon substrate. Here, in the semiconductor chip 11a, the directional couplers 16a, 16b as well as the amplifier parts 14a, 14b including the HBT are also formed. Then, in the present fifth embodiment, an example is described, in which the HBT and the directional couplers 16a, 16b are formed in the semiconductor chip 11a.

Figure 28:
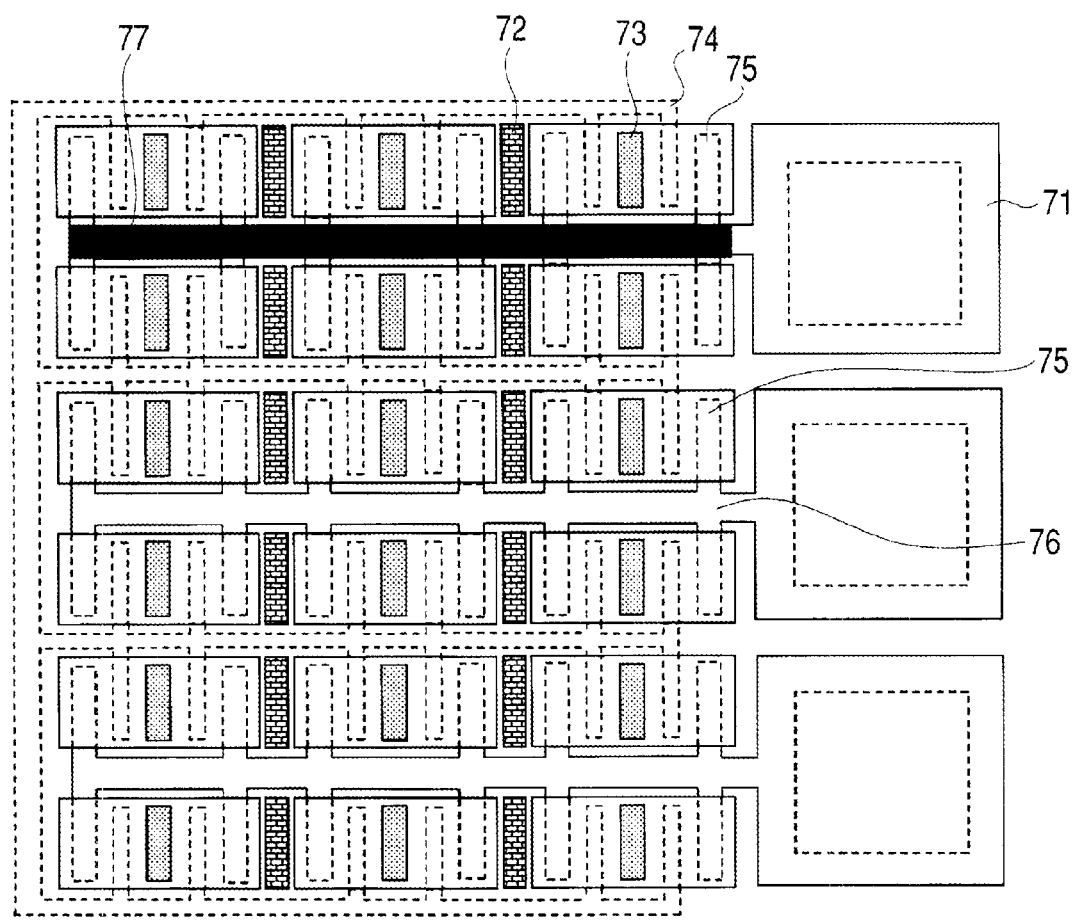
FIG. 28 is a top view showing a layout configuration of a final amplifier in a fifth embodiment.

In the present fifth embodiment also, the amplifier parts 14a, 14b are formed so as to have the three-stage amplifier stage. FIG. 28 is a diagram showing a layout configuration of the final stage amplifier, which is the final stage of the three-stage amplifier. In FIG. 28, the final stage amplifier is divided into a plurality of cell regions by element isolation regions 72. In each cell region, the HBT is formed. From the cell region, an emitter wire 73, a base wire 74, and a collector wire 75 are drawn out. Then, the collector wire 75 drawn out from each cell region is electrically coupled to a collector lead wire 76 and the collector lead wire 76 is coupled to a pad (collector pad) 71.

According to the final stage amplifier configured as described above, the power that has propagated through the base wire 74 enters the HBT and the power entered the HBT is amplified and output from the collector wire 75 and the collector lead wire 76 to the pad 71. In other words, the amplified power propagates through the collector wire 75 and the collector lead wire 76. Because of this, in the present fifth embodiment, the predetermined collector lead wire 76 through which the amplified power propagates is used as the mainline and a sub-line 77 is provided on the predetermined collector lead wire 76, which will serve as the main line. Due to this, the directional coupler is formed by the main line including the predetermined collector lead wire 76 and the sub-line 77 formed on the main line. As a result, it is possible to detect power that propagates through the collector lead wire 76 with the directional coupler.

Here, it is also possible to configure the directional coupler by using the collector wire 75 as the main line and providing the sub-line 77 on the collector wire 75. However, as shown in FIG. 28, the collector wire 75 is shorter in length than the collector lead wire 76 that couples a plurality of the collector wires 75. The degree of coupling of the directional coupler increases with the increasing length of the main line and the sub-line, and therefore, in the directional coupler in which the collector wire 75 is used as the main line, the degree of coupling is smaller than that of the directional coupler in which the collector lead wire 76 is used as the main line.

Because of this, in the present fifth embodiment, the degree of coupling of the directional coupler is increased by employing a configuration in which the collector lead wire 76 is used as the main line and the sub-line 77 is provided on the main line.

Figure 29:
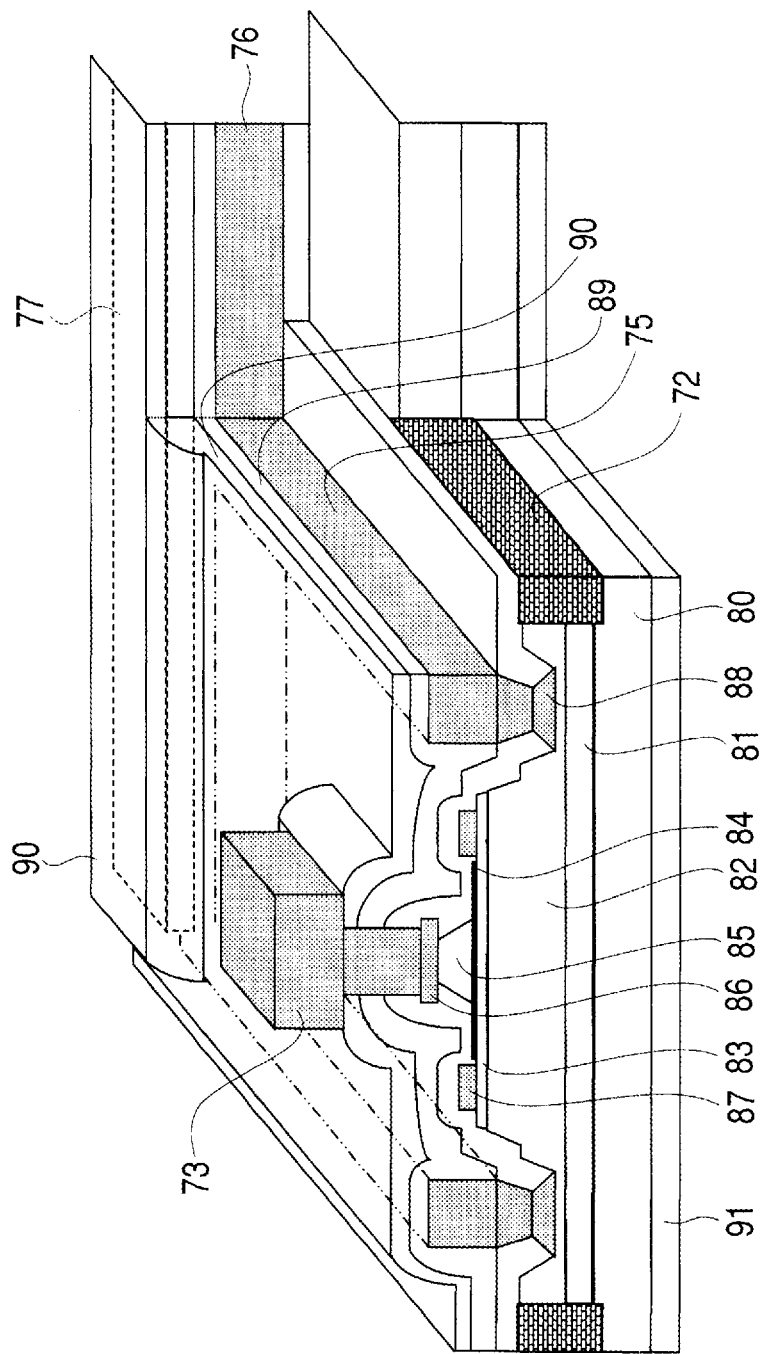
FIG. 29 is a cross-sectional perspective view showing a partial section of a structure including a directional coupler and an HBT.

FIG. 29 is a sectional perspective view showing a partial section of a structure including the directional coupler and the HBT. As shown in FIG. 29, the element formation region is separated by the element separation region 72. In the separated element formation region, a sub-collector semiconductor layer 81 is formed on a GaAs substrate 80, which is a semi-insulating substrate, and on the sub-collector semiconductor layer 81, a collector semiconductor layer 82 is formed. The sub-collector semiconductor layer 81 is formed by an $n^+$-type GaAs layer and the collector semiconductor layer 82 is formed by an $n^-$-type GaAs layer. Then, an opening is provided in the collector semiconductor layer 82 and in the opening, a collector electrode 88 is formed. The collector electrode 88 is electrically coupled with the collector wire 75.

On the collector semiconductor layer 82, a base semiconductor layer 83 is formed and a base electrode 87 is formed so as to couple to the base semiconductor layer 83. The base semiconductor layer 83 is formed by a $p^+$-type GaAs layer. On the base semiconductor layer 83, an emitter semiconductor layer 84 is formed and on the emitter semiconductor layer 84, a GaAs layer 85 is formed. Then, on the GaAs layer 85, an emitter electrode 86 is formed and onto the emitter electrode 86, the emitter wire 73 is electrically coupled. The emitter semiconductor layer 84 is formed by an $n^-$-type InGaP layer. In this manner, the HBT is formed in the element formation region.

The collector wire 75 coupled with the collector electrode 88 of the HBT is coupled with the collector lead wire 76. The collector lead wire 76 is used as the main line of the directional coupler. On the collector lead wire 76, an insulating film 89 is formed and on the collector lead wire 76 via the insulating film 89, the sub-line 77 of the directional coupler is formed. Then, an insulating film 90 is formed so as to cover the sub-line 77. On the other hand, on the backside of the GaAs substrate 80, a backside electrode 91 is formed. In this manner, the HBT and the directional coupler are formed on the GaAs substrate 80.

The semiconductor device in the present fifth embodiment is configured as described above and its manufacture method will be described below with reference to the drawings.

Figure 30:
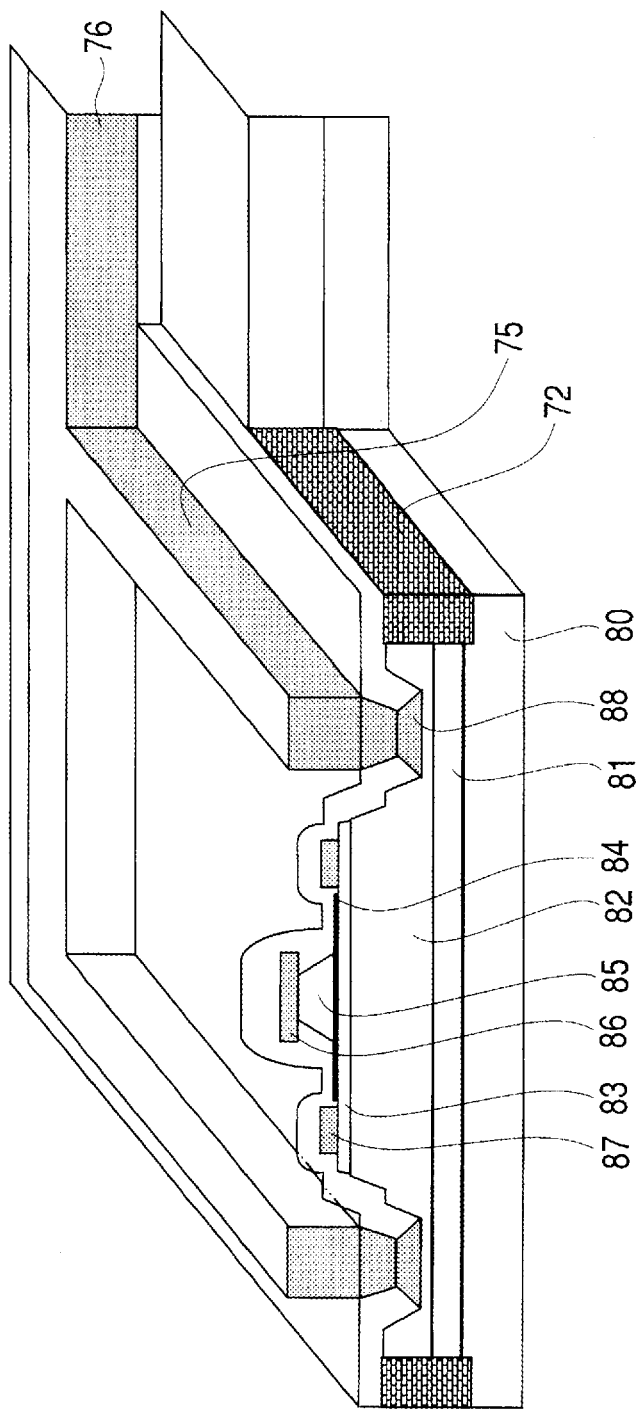
FIG. 30 is a cross-sectional perspective view showing a manufacturing process of a semiconductor device in the fifth embodiment.

As shown in FIG. 30, a semi-insulating substrate is prepared in a wafer state. A semi-insulating substrate is a substrate including a compound semiconductor with a wide forbidden band. In a compound semiconductor with a wide forbidden band, when impurities of a certain kind are added, a deep level is formed in the forbidden band and electrons and holes are fixed at the deep level and the carrier density becomes very low and thus it becomes more like an insulator. Such a substrate is called a semi-insulating substrate. In the present fifth embodiment, the GaAs substrate 80 is used as a semi-insulating substrate as an example, however, an InP substrate etc. may be used. In the GaAs substrate 80, a deep level is formed by doping Cr, In, oxygen, etc., or introducing arsenic excessively, and it becomes a semi-insulating substrate.

Next, the sub-collector semiconductor layer 81 is formed on the GaAs substrate 80 and on the sub-collector semiconductor layer 81, the collector semiconductor layer 82 is formed. The sub-collector semiconductor layer 81 is formed by, for example, an $n^+$-type GaAs layer and the collector semiconductor layer 82 is formed by an $n^-$-type GaAs layer. The $n^+$-type GaAs layer and the $n^-$-type GaAs layer can be formed by doping silicon (Si) etc., which is n-type impurities, to a GaAs layer and for example, can be formed by the epitaxial growth method. Further, on the collector semiconductor layer 82, the base semiconductor layer 83 is formed and on the base semiconductor layer 83, the emitter semiconductor layer 84 is formed. The base semiconductor layer 83 is formed by a p$^+$-type GaAs layer. The p$^+$-type GaAs layer can be formed by doping carbon (C), which is p-type impurities, to a GaAs layer and for example, can be formed by the epitaxial growth method. The emitter semiconductor layer 84 is formed by an n$^-$-type InGaP layer. The n$^-$-type InGaP layer is formed by doping silicon (Si), which is n-type impurities, to an InGaP layer, and for example, can be formed by the epitaxial growth method. On the emitter semiconductor layer 84, the GaAs layer 85 is formed by, for example, the epitaxial growth method.

Subsequently, after a WSiN film is formed on the GaAs layer 85, the WSiN film and the GaAs layer are patterned using the photolithography technique and the etching technique. Due to this, the emitter electrode 86 including a WSiN film can be formed.

Next, the element isolation region 72 is formed. The element isolation region 72 is formed by introducing helium ions into the surface of the GaAs substrate 80, the sub-collector semiconductor layer 81, the collector semiconductor layer 82, the base semiconductor layer 83, and the emitter semiconductor layer 84. In the present fifth embodiment, helium is introduced in order to form the element isolation region 72, however, the element to be introduced is not limited to helium. In other words, the element isolation region 72 can be formed by introducing a non-metal element to the semiconductor layer, and therefore, as an element to be introduced into the semiconductor layer, any non-metal element may be used. In particular, it is desirable to introduce elements deep into the semiconductor layer in order to form the element isolation region 72, and therefore, as a non-metal element, hydrogen (H), helium (He), boron (B), etc., can be used. Among such light-weighted elements, it is desirable to use helium from the standpoint that the reliability of the element is unlikely to be affected.

Subsequently, in the element isolation region, an opening that reaches the base semiconductor layer 83 is formed and a Mo/Au/Pt/Ti/Pt film is formed so as to fill the opening. Then, the Mo/Au/Pt/Ti/Pt film, the emitter semiconductor layer 84, and the base semiconductor layer 83 are patterned using the photolithography technique and the etching technique. Due to this, the base electrode 87 including the Mo/Au/Pt/Ti/Pt film can be formed on the base semiconductor layer 83.

Next, a groove is formed in the collector semiconductor layer 82 in the element formation region by using the photolithography technique and the etching technique. Then, on the GaAs substrate 80, an Au/Ni/AuGe film is formed. Then, the Au/Ni/AuGe film is patterned by using the photolithography technique and the etching technique to form the collector electrode 88.

Subsequently, a protective film is formed on the GaAs substrate 80. The protective film is formed by, for example, a silicon oxide film, and can be formed using the CVD (Chemical Vapor Deposition) method. Then, the protective film is patterned using the lithography technique and the etching technique. Patterning is carried out so that the top surface of the collector electrode 88 is exposed.

Next, a Pt/Au/Ti film is formed on the GaAs substrate 80. Then, the Pt/Au/Ti film is patterned using the photolithography technique and the etching technique. Due to this, it is possible to form the collector wire 75 that electrically couples to the collector electrode 88 and the collector lead wire 76 that couples to the collector wire 75. The predetermined collector lead wire 76 functions also as the main line of the directional coupler. Although not shown in FIG. 30, a base wire (not shown) that couples to the base electrode 87 is also formed.

Figure 31:
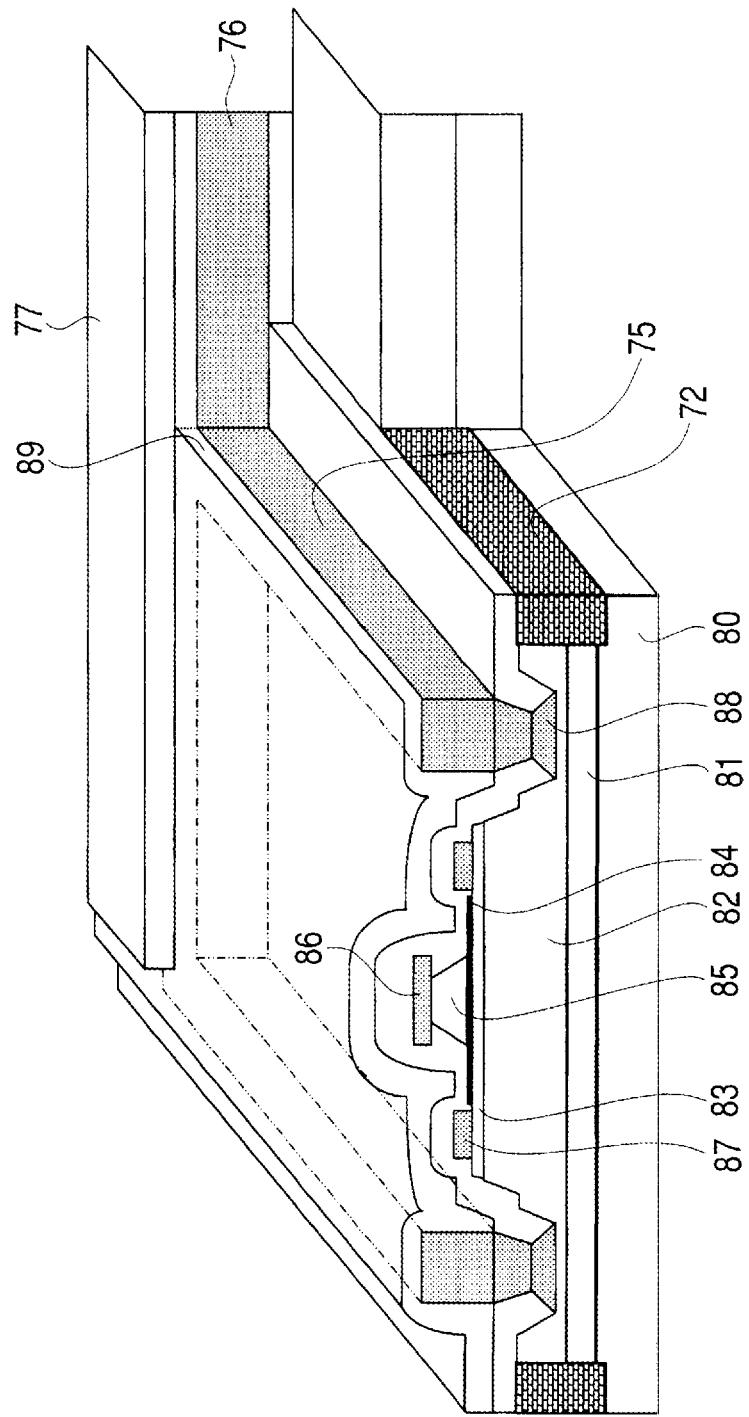
FIG. 31 is a cross-sectional perspective view showing a manufacturing process of the semiconductor device following FIG. 30.

Subsequently, as shown in FIG. 31, the insulating film 89 is formed on the GaAs substrate 80. The insulating film 89 is formed by, for example, a silicon oxide film and can be formed using the CVD method. Then, after a metal film is formed on the insulating film 89, the metal film is patterned using the lithography technique and the etching technique. Due to this, the sub-line 77 including a metal film is formed. The sub-line 77 is formed so as to be parallel to the collector lead wire 76.

Next, as shown in FIG. 29, after the insulating film 90 is formed on the GaAs substrate 80, the insulating film 90, the insulating film 89, etc., are patterned using the lithography technique and the etching technique. Patterning is carried out so that the top surface of the emitter electrode 86 is exposed.

Then, an Au/Ti film is formed on the GaAs substrate 80. Then, the Au/Ti film is patterned using the lithography technique and the etching technique. Due to this, it is possible to form the emitter wire 73 that electrically couples to the emitter electrode 86.

Subsequently, the backside electrode 91 is formed on the backside of the GaAs substrate 80. After this, the wafer including the GaAs substrate 80 is diced for each chip region and thus semiconductor chips can be obtained. Then, the semiconductor chip is mounted on the mounting substrate and thus the RF power module is manufactured. In this manner, in the present fifth embodiment, it is possible to form the directional coupler as well as the HBT inside the semiconductor chip. In the present fifth embodiment also, it is possible to miniaturize the mounting substrate because the directional coupler is formed inside the semiconductor chip.

The present invention of the present inventors is described specifically as above based on the embodiments, however, it is obvious that the present invention is not limited to the embodiments and various modifications are possible in the scope not deviating from its concept.

The present invention can be used widely in the industry for manufacturing a semiconductor device.

What is claimed is:
1. A semiconductor device comprising:
a semiconductor chip including a power amplifier circuit,
a semiconductor substrate,
wherein the semiconductor chip is disposed over the semiconductor substrate and has:
  (a) a transistor constituting the power amplifier circuit disposed over the semiconductor substrate;
  wherein the transistor comprises:
    (a1) a plurality of drain wires coupled to a drain region of the transistor; and
    (a2) a plurality of source wires coupled to a source region of the transistor, wherein the drain wires and source wires extend in a predetermined direction, and the drain wires and the source wires are arranged by turns in parallel to each other; and
  (b) a directional coupler disposed over the semiconductor substrate and that detects power output from the power amplifier circuit;
  wherein the directional coupler includes:
    (b1) a main line using one of the drain wires of the transistor; and
    (b2) a sub-line, adjacent to the main line, having a first terminal and a second terminal, the first terminal of which is electrically coupled with a detector circuit that converts an output from the directional coupler into a voltage or current and the second terminal is electrically coupled with a GND via a passive element; and wherein the main line and the sub-line are arranged in parallel to each other and no conductor exists between the main line and the sub-line, wherein the main line and the sub-line are disposed in a same horizontal plane of a wire layer, wherein the power amplifier circuit and the directional coupler are disposed integrally in the semiconductor chip, and wherein the sub-line is disposed above a part of one of the source wires coupled to the transistor.

2. The semiconductor device according to claim 1, wherein the semiconductor chip has the detector circuit that converts the output from the directional coupler into a voltage or current.

3. The semiconductor device according to claim 2, wherein the semiconductor chip has the detector circuit that converts the output from the directional coupler into a voltage or current and a control circuit that controls the transistor constituting the power amplifier circuit so that the output power from the power amplifier circuit is constant based on an output of the detector circuit.

4. The semiconductor device according to claim 2, wherein a linear amplifier that amplifies the output from the directional coupler is coupled between the directional coupler and the detector circuit.

5. The semiconductor device according to claim 1, wherein the transistor is a field effect transistor.

6. The semiconductor device according to claim 1, wherein an insulating film is formed between the main line and the sub-line.

7. The semiconductor device according to claim 6, wherein a distance between the main line and the sub-line is 2 μm or less.

8. A semiconductor device comprising:
a semiconductor chip including a power amplifier circuit,
a semiconductor substrate,
wherein the semiconductor chip is disposed over the semiconductor substrate and has:
  (a) a transistor constituting the power amplifier circuit disposed over the semiconductor substrate;
  wherein the transistor comprises:
    (a1) a plurality of drain wires coupled to a drain region of the transistor; and
    (a2) a plurality of source wires coupled to a source region of the transistor, wherein the drain wires and source wires extend in a predetermined direction, and the drain wires and the source wires are arranged by turns in parallel to each other;
  (b) a plurality of wire layers each disposed in a different horizontal plane over the semiconductor substrate;
  wherein the wire layers include:
    (b1) a first wire layer including the drain wires and the source wires,
    (b2) a second wire layer, upper horizontal plane of the first wire layer, including the drain wires, and
  (c) a directional coupler disposed over the semiconductor substrate and that detects power output from the power amplifier circuit;
  wherein the directional coupler includes:
    (c1) a main line using one of the drain wires of the transistor; and
    (c2) a sub-line, adjacent to the main line, having a first terminal and a second terminal, the first terminal of which is electrically coupled with a detector circuit that converts an output from the directional coupler into a voltage or current and the second terminal is electrically coupled with a GND via a passive element; and wherein the main line and the sub-line are arranged in parallel to each other and no conductor exists between the main line and the sub-line, wherein the main line and the sub-line are disposed in a same horizontal plane of a wire layer, wherein the power amplifier circuit and the directional coupler are disposed integrally in the semiconductor chip, and wherein the sub-line is disposed above a part of one of the source wires coupled to the transistor.

9. The semiconductor device according to claim 8, wherein the semiconductor chip has the detector circuit that converts the output from the directional coupler into a voltage or current.

10. The semiconductor device according to claim 9, wherein the semiconductor chip has the detector circuit that converts the output from the directional coupler into a voltage or current and a control circuit that controls the transistor constituting the power amplifier circuit so that the output power from the power amplifier circuit is constant based on an output of the detector circuit.

11. The semiconductor device according to claim 10, wherein a linear amplifier that amplifies the output from the directional coupler is coupled between the directional coupler and the detector circuit.

12. The semiconductor device according to claim 8, wherein the transistor is a field effect transistor.

13. The semiconductor device according to claim 8, wherein the transistor is a bipolar transistor.

14. The semiconductor device according to claim 8, wherein an insulating film is formed between the main line and the sub-line.

15. The semiconductor device according to claim 14, wherein a distance between the main line and the sub-line is 2 μm or less.

16. A semiconductor device comprising:
a semiconductor chip including a power amplifier circuit,
a semiconductor substrate,
wherein the semiconductor chip is disposed over the semiconductor substrate and has:
  (a) a transistor constituting the power amplifier circuit disposed over the semiconductor substrate;
  wherein the transistor comprises:
    (a1) a plurality of drain wires coupled to a drain region of the transistor; and
    (a2) a plurality of source wires coupled to a source region of the transistor, wherein the drain wires and source wires extend in a predetermined direction, and the drain wires and the source wires are arranged by turns in parallel to each other; and
  wherein a number of wire layers that forms the source wires is smaller than a number of wire layers that form the drain wire; and
  (b) a directional coupler disposed over the semiconductor substrate and that detects power output from the power amplifier circuit;
  wherein the directional coupler includes:
    (b1) a main line using one of the drain wires of the transistor; and
    (b2) a sub-line, adjacent to the main line, having a first terminal and a second terminal, the first terminal of which is electrically coupled with a detector circuit that converts an output from the directional coupler into a voltage or current and the second terminal is electrically coupled with a GND via a passive element; and wherein the main line and the sub-line are arranged in parallel to each other and no conductor exists between the main line and the sub-line, wherein the main line and the sub-line are disposed in a same horizontal plane of a wire layer, wherein the power amplifier circuit and the directional coupler are disposed integrally in the semiconductor chip, and wherein the sub-line is disposed above a part of one of the source wires coupled to the transistor.

17. The semiconductor device according to claim 16, wherein the semiconductor chip has the detector circuit that converts the output from the directional coupler into a voltage or current.

18. The semiconductor device according to claim 17, wherein the semiconductor chip has the detector circuit that converts the output from the directional coupler into a voltage or current and a control circuit that controls the transistor constituting the power amplifier circuit so that the output power from the power amplifier circuit is constant based on an output of the detector circuit.

19. The semiconductor device according to claim 17, wherein a linear amplifier that amplifies the output from the directional coupler is coupled between the directional coupler and the detector circuit.

20. The semiconductor device according to claim 16, wherein the transistor is a field effect transistor.

21. The semiconductor device according to claim 16, wherein an insulating film is formed between the main line and the sub-line.

* * * * *